(12) United States Patent
Arahari et al.

(10) Patent No.: US 6,590,314 B1
(45) Date of Patent: Jul. 8, 2003

(54) PIEZOELECTRIC RESONATOR CONTAINER, PIEZOELECTRIC RESONATOR USING THE SAME, CIRCUIT BOARD MOUNTING PIEZOELECTRIC RESONATOR THEREON, AND METHOD FOR MANUFACTURING PIEZOELECTRIC RESONATOR

(75) Inventors: Hiroshi Arahari, deceased, late of Okaya (JP), by Teruo Arahari, legal heir; Eiji Karaki, Ina (JP); Setsuhiro Hama, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/529,082

(22) PCT Filed: Aug. 4, 1999

(86) PCT No.: PCT/JP99/04245

§ 371 (c)(1),
(2), (4) Date: Jun. 1, 2001

(87) PCT Pub. No.: WO00/08755

PCT Pub. Date: Feb. 17, 2000

(30) Foreign Application Priority Data

Aug. 7, 1998 (JP) .......................................... 10-224905

(51) Int. Cl.$^7$ ............................................... H01L 41/08
(52) U.S. Cl. ..................................................... 310/344
(58) Field of Search .................. 310/340, 344, 310/348

(56) References Cited

U.S. PATENT DOCUMENTS 5,631,609 A * 5/1997 Oka et al. ............... 310/344 X
5,898,256 A * 4/1999 Ide et al. ..................... 310/344
6,005,329 A * 12/1999 Ikeda et al. .................. 310/340

FOREIGN PATENT DOCUMENTS

| JP | A-53-61294 | 6/1978 |
| JP | A-53-82287 | 7/1978 |
| JP | A-54-29597 | 3/1979 |
| JP | U-58-66723 | 5/1983 |
| JP | U-2-55727 | 4/1990 |
| JP | U-2-60323 | 5/1990 |
| JP | A-3-220910 | 9/1991 |
| JP | A-9-64679 | 3/1997 |
| JP | A-9-162345 | 6/1997 |
| JP | A-10-163788 | 6/1998 |
| WO | WO A1 97/08826 | 3/1997 |

* cited by examiner

Primary Examiner—Mark O. Budd
(74) Attorney, Agent, or Firm—Oliff & Berridge, PLC

(57) ABSTRACT

In a piezoelectric resonator container having a cylindrical case, one end of which is an open end, and a stem for sealing the open end of the case, an outer peripheral face of the stem and an inner peripheral face of the case have a nearly elliptical shape or an elliptical shape, respectively. A pressure allowance when pressing the stem into the open end of the case monotonically increases from a major axis portion of the case toward a minor axis portion. Therefore, since the pressure allowance is large at minor axis portions where vertical stress tends to decrease and the pressure allowance is small at major axis portions where tensile stress tends to increase, incomplete gas-tightness due to inadequate sealing or breaking of the case does not occur. This provides a piezoelectric resonator container in which incomplete gas-tightness is not caused, even if an elliptical or a nearly elliptical case is used, and a piezoelectric resonator piece does not come into contact with the inner periphery of the case.

32 Claims, 30 Drawing Sheets

(A)

(B)

(C)

(A)

(B)

(A)

(B)

(A)

(B)

(C)

PIEZOELECTRIC RESONATOR CONTAINER, PIEZOELECTRIC RESONATOR USING THE SAME, CIRCUIT BOARD MOUNTING PIEZOELECTRIC RESONATOR THEREON, AND METHOD FOR MANUFACTURING PIEZOELECTRIC RESONATOR

BACKGROUND OF THE INVENTION

1. Field of the Invention

The present invention relates to a piezoelectric resonator container for containing therein piezoelectric resonator pieces, such as quartz crystal resonators, to a piezoelectric resonator using the piezoelectric resonator container, to a circuit board having the piezoelectric resonator mounted thereon, and to a method for manufacturing a piezoelectric resonator. More particularly, the present invention relates to a technique for sealing an open end of an elliptical or nearly elliptical cylindrical case used in a piezoelectric resonator container.

2. Background of Related Art

Piezoelectric resonators used in various electronic devices are incorporated into the electronic devices in a state of being contained in containers. In some piezoelectric resonators, thin plate piezoelectric resonators are used in which electrodes are formed in predetermined patterns on piezoelectric resonator pieces, such as the tuning fork type or AT cut quartz crystal pieces. Therefore, if elliptical or nearly elliptical cylindrical cases are used corresponding to the shape of the piezoelectric resonator pieces, the piezoelectric resonator pieces can be efficiently contained, and the- thickness of the piezoelectric resonators can be reduced. An example of such containers is disclosed in Japanese Unexamined Utility Model Application Publication No. 2-55727. The piezoelectric resonator container has a structure such that a piezoelectric resonator is contained in a nearly elliptical case, and a stem is pressed into the open end of the case to be sealed.

However, according to the structure in which the nearly elliptical case is sealed by pressure as in the piezoelectric resonator container disclosed in Japanese Unexamined Utility Model Publication No. 2-55727, since the contact surface pressure between the case and the stem varies in a circumferential direction, leakage tends to occur at a portion of low contact surface pressure.

As a piezoelectric resonator container for solving such a problem, Domestic Republication of PCT international Publication for Patent Application No. WO97/08826 discloses a piezoelectric resonator container in which a pressure allowance is maximized between a minor axis portion and a major axis portion, when pressing a stem having an elliptical or nearly elliptical outer peripheral shape into a case having an elliptical or nearly elliptical inner peripheral shape. According to this arrangement, since the pressure allowance of a section where incomplete gas-tightness is empirically most likely to occur is maximized, the incomplete gas-tightness at this portion can be prevented.

However, in the piezoelectric resonator container in which the pressure allowance is maximized between the minor axis portion and the major axis portion, a portion is generated where stress (tensile stress) applied in the circumferential direction of the case during the application of pressure has a maximum. As a result, the case may break at this portion, and incomplete gas-tightness occurs.

SUMMARY OF THE INVENTION

It is an object of the present invention to realize a piezoelectric resonator container which solves the above problems and. in which incomplete gas-tightness does not occur even if an elliptical or nearly elliptical case is used, a piezoelectric resonator using the same, a circuit board having the piezoelectric resonator mounted thereon, and a method for manufacturing a piezoelectric resonator, and to realize a piezoelectric resonator container in which a piezoelectric resonator piece does not come into contact with the inner periphery of the case even if an oblate case, such as an elliptical or nearly elliptical case, is used.

In accordance with one aspect of the invention, there is provided a piezoelectric resonator container which may a consist of a cylindrical case, one end of which is an open end; and a stem for sealing the open end of the case, wherein, in a cross section of the stem in a direction perpendicular to an axial direction of the case at a portion contacting the case, an outer periphery of the stem includes a minor axis portion having a first radius of curvature, and a major axis portion having a second radius of curvature smaller than the first radius of curvature, and a tangent to the first radius of curvature coincides with a tangent to the second radius of curvature at a connection portion of the first radius of curvature and the second radius of curvature, wherein, in a cross section of the case in a direction perpendicular to an axial direction of the case at a portion contacting the stem, an inner periphery of the case includes a minor axis portion having a third radius of curvature, and a major axis portion having a fourth radius of curvature smaller than the third radius of curvature, and a tangent to the third radius of curvature coincides with a tangent to the fourth radius of curvature at a connection portion of the third radius of curvature and the fourth radius of curvature, and wherein a pressure allowance when pressing the stem into the open end of the case monotonically increases from the major axis of the case toward the minor axis.

In accordance with another aspect of the invention, there is provided a piezoelectric resonator in which a piezoelectric resonator piece is contained in a piezoelectric resonator container having a cylindrical case, one end of which is an open end, and a stem for sealing the open end of the case, wherein, in a cross section of the stem in a direction perpendicular to an axial direction of the case at a portion contacting the case, an outer periphery of the stem includes a minor axis portion having a first radius of curvature, and a major axis portion having a second radius of curvature smaller than the first radius of curvature, and a tangent to the first radius of curvature coincides with a tangent to the second radius of curvature at a connection portion of the first radius of curvature and the second radius of curvature, wherein, in a cross section of the case in a direction perpendicular to an axial direction of the case at a portion contacting the stem, an inner periphery of the case includes a minor axis portion having a third radius of curvature, and a major axis portion having a fourth radius of curvature smaller than the third radius of curvature, and a tangent to the third radius of curvature coincides with a tangent to the fourth radius of curvature at a connection portion of the third radius of curvature and the fourth radius of curvature, and wherein a pressure allowance when pressing the stem into the open end of the case monotonically increases from the major axis of the case toward the minor axis.

In the above aspect of the invention, since the outer periphery of the stem and the inner periphery of the case have a nearly elliptical shape formed of two types of large and small arcs, a flat piezoelectric resonator piece can be efficiently contained, and the thickness of the piezoelectric resonator can be reduced. Since the pressure allowance is increased at the minor axis portion where the vertical stress tends to decrease, the vertical stress is above the lower limit value over the entirety thereof. Therefore, incomplete gas-tightness due to inadequate sealing does not occur. Furthermore, since the pressure allowance is set to be small at the major axis portion where the tensile stress tends to increase, the tensile stress is below the upper limit value over the entirety thereof. For this reason, incomplete gas-tightness due to the breaking of the case does not occur. Therefore, according to the present invention, a piezoelectric resonator with a high degree of reliability can be constructed.

In accordance with an aspect of the invention, there is provided a piezoelectric resonator container which may consist of a cylindrical case, one end of which is an open end; and a stem for sealing the open end of the case, wherein, in a cross section of the stem in a direction perpendicular to an axial direction of the case at a portion contacting the case, an outer periphery of the stem has an elliptical shape, wherein, in a cross section of the case in a direction perpendicular to an axial direction of the case at a portion contacting the stem, an inner periphery of the case has an elliptical shape, and wherein a pressure allowance when pressing the stem into the open end of the case monotonically increases from the major axis of the case toward the minor axis.

In accordance with another aspect of the invention, there is provided a piezoelectric resonator in which a piezoelectric resonator piece is contained in a piezoelectric resonator container having a cylindrical case, one end of which is an open end, and a stem for sealing the open end of the case, wherein, in a cross section of the stem in a direction perpendicular to an axial direction of the case at a portion contacting the case, an outer periphery of the stem has an elliptical shape, wherein, in a cross section of the case in a direction perpendicular to an axial direction of the case at a portion contacting the stem, an inner periphery of the case has an elliptical shape, and wherein a pressure allowance when pressing the stem into the open end of the case monotonically increases from the major axis of the case toward the minor axis.

In the above aspect of the invention, since the outer periphery of the stem and the inner periphery of the case have an elliptical shape, a flat piezoelectric resonator piece can be efficiently contained, and the thickness of the piezoelectric resonator can be reduced. Since the pressure allowance is set to be large at the minor axis portion where the vertical stress tends to decrease, the vertical stress is above the lower limit value over the entirety thereof. In addition, since the pressure allowance is set to be small at the major axis portion where the tensile stress tends to increase, the tensile stress is below the upper limit value over the entirety thereof. Therefore, since incomplete gas-tightness due to inadequate sealing or the breaking of the case does not occur, a piezoelectric resonator with a high degree of reliability can be constructed.

In accordance with another aspect of the invention, there is provided the feature of the above aspect, wherein the inner peripheral edge of the open end of the case is formed into a tapered face in a cross section in the axial direction of the case, and wherein a shoulder part located in the pressure direction of the stem is arcuate in a cross section in the axial direction of the case, and the radius of curvature of the arc is larger at the minor axis portion than that at the major axis portion of the stem.

In the above aspect of the invention, since the pressure allowance when pressing the stem into the open end of the case monotonically increases from the major axis to the minor axis, only a shoulder part corresponding to the minor axis portion of the stem abuts against the tapered face of the open end of the case when the stem is registered against the open end of the case. Therefore, in the above aspect of the invention, a problem of the occurrence of displacement of the stem is not solved.

In the above aspect of the invention, however, since the radius of curvature of the arc of the shoulder part of the stem is small at the major axis portion and is large at the minor axis portion, the shoulder part tends to project at the major axis portion. Therefore, since the shoulder part of the minor axis portion of the stem, the shoulder part between the minor axis portion and the major axis portion, and the shoulder part of the major axis portion abut against the tapered face of the case at about the same time, the shoulder parts of the stem come into contact with the tapered portion of the case over the entirety thereof. Thus, since the stem is not displaced from the case, incomplete gas-tightness due to the displacement does not occur.

In accordance with another aspect of the invention, there is provided the feature the above aspect, wherein the inner peripheral edge of the open end of the case is formed into a tapered face in a cross section in the axial direction of the case, and wherein a shoulder part located in the pressure direction of the stem is arcuate in a cross section in the axial direction of the case, and the center position of the arc is located toward the major axis portion from the minor axis portion of the stem in the pressure direction.

In the above aspect of the invention, since the center position of the arc formed on the shoulder part of the stem is located toward the major axis portion from the minor axis portion of the stem in the pressure direction, the shoulder part tends to project at the major axis portion. Therefore, the shoulder part of the minor axis portion of the stem, the shoulder part between the minor axis portion and the major axis portion, and the shoulder part of the major axis portion abut against the tapered face of the case at about the same time. Therefore, the shoulder parts of the stem come into contact with the tapered portion of the case over the entirety thereof. Thus, since the stem is not displaced from the case, incomplete gas-tightness due to the displacement does not occur.

In accordance with another aspect of the invention, there is provided the feature of the above aspect, wherein the inner peripheral edge of the open end of the case is formed into a tapered face in a cross section in the axial direction of the case, and an angle which the tapered face forms with the axial direction is smaller at the minor axis portion than that at the major axis portion.

In the above aspect of the invention, the shoulder part of the minor axis portion of the stem, the shoulder part between the minor axis portion and the major axis portion, and the shoulder part of the major axis portion abut against the tapered face of the case at about the same time. Therefore, the shoulder parts of the stem come into contact with the tapered portion of the case over the entirety thereof. Thus, since the stem is not displaced from the case, incomplete gas-tightness due to the displacement does not occur.

In accordance with another aspect of the invention, there is provided the feature of the above aspects, wherein the inner peripheral edge of the open end of the case is formed into a tapered face in a cross section in the axial direction of the case, and the position of the tapered face in the axial direction is located toward the minor axis portion from the major axis portion of the case in the pressure direction.

In the above aspect of the invention, the shoulder part of the minor axis portion of the stem, the shoulder part between the minor axis portion and the major axis portion, and the shoulder part of the major axis portion abut against the tapered face of the case at about the same time. Therefore, the shoulder parts of the stem come into contact with the tapered portion of the case over the entirety thereof. Thus, since the stem is not displaced from the case, incomplete gas-tightness due to the displacement does not occur.

In accordance with another aspect of the invention, there is provided the feature of the another aspect, wherein projections abutting against the inner peripheral edge of the open end of the case which is formed as the tapered face are formed at four sections corresponding to between the major axis portion and the minor axis portion of shoulder parts located in the pressure direction.

In the above aspect of the invention, when the stem is registered at the open end of the case, four projections formed between the major axis portion and the minor axis portion abut against the tapered face of the case. In this state, since the four projections prevent the stem from being rotated with respect to the case, the stem is not displaced from the case. Therefore, incomplete gas-tightness due to the displacement does not occur.

In accordance with another aspect of the invention, there is provided the feature of, wherein the projections are formed by deep-drawing a metal outer ring constituting the stem.

In accordance with another aspect of the invention, there is provided the feature of the above aspect, wherein the projections are formed by solder balls.

In accordance with another aspect of the invention, there is provided the feature of the above aspect, wherein the projections are formed by thick solder plating.

In accordance with another aspect of the invention, there is provided the feature of the above aspect, wherein the thickness of the case at the major axis portion is less than the thickness at the minor axis portion.

In the above aspect of the invention, since the thickness is reduced at the major axis portion where the tensile stress tends to increase, tensile stress generated at the major axis portion decreases, and the case can be prevented from being broken at the portion. A reduction in the thickness of the case at the minor axis portion offers an advantage in that the case is difficult to deform, even if pressure is applied to the minor axis portion, as compared with a situation in which the case has a uniform thickness.

In accordance with another aspect of the invention, there is provided the feature of any one of the above aspect, wherein, in leads fixed to the stem, diameters of inner lead portions to be superimposed on mounting portions of the piezoelectric resonator in the case are smaller than those of other lead portions.

In the above aspect of the invention, even if the case is flattened and the pressure allowance of the minor axis portion is increased, a gap size between the piezoelectric resonator piece and the inner periphery of the case is wide by the degree of thinness of the inner lead portions. Therefore, since the piezoelectric resonator piece does not touch the inner periphery of the case, even if it is flexed by a fall or the like, breakage or chipping of the piezoelectric resonator piece can be prevented.

In accordance with another aspect of the invention of claim 24, there is provided the feature of any one of the above aspect, in leads fixed to the stem, inner lead portions to be superimposed on mounting portions of the piezoelectric resonator in the case are flattened.

In the above aspect of the invention, even if the case is flattened and the pressure allowance of the minor axis portion is increased, a gap size between the piezoelectric resonator piece and the inner periphery of the case is wide by the degree of flatness of the inner lead portions. Therefore, since the piezoelectric resonator piece does not touch the inner periphery of the case even if it is flexed by a fall or the like, breakage or chipping of the piezoelectric resonator piece can be prevented.

In accordance with another aspect of the invention, there is provided the feature of the above aspect, wherein the inner lead portions are formed with projections projecting toward the outside from the flat faces of the inner lead portions.

In the above aspect of the invention, the inner lead portions can be pressed with uniform force toward the piezoelectric resonator piece via the projections, even if the flat inner lead portions are inclined or rotated. Therefore, the inner lead portions and mounting portions of the piezoelectric resonator piece can be securely connected by a conductive adhesive agent or solder.

In accordance with another aspect of the invention, there is provided the feature of the above aspect, wherein the projections are formed by solder balls.

In accordance with another aspect of the invention, there is provided the feature of the above aspect, wherein the projections are formed by thick solder plating.

In accordance with another aspect of the invention, there is provided the feature of the above aspect, wherein the projections are formed by deformed portions of the inner lead portions.

In accordance with another aspect of the invention, there is provided the feature of any one of the above aspect, wherein, in leads fixed to the stem, inner lead portions to be superimposed on mounting portions of the piezoelectric resonator piece in the case are bent so that an end portion of the piezoelectric resonator piece is placed in the center of a thickness direction of the piezoelectric resonator.

In the above aspect of the invention, even if the case is flattened and the pressure allowance of the minor axis portion is increased, a gap size between the piezoelectric resonator piece and the inner periphery of the case is wide by the degree of bending of the inner lead portions. Therefore, since the piezoelectric resonator piece does not touch the inner periphery of the case, even if it is flexed by a fall or the like, breakage or chipping of the piezoelectric resonator piece can be prevented.

In accordance with another aspect of the invention, there is provided the feature of any one of the above aspects, wherein the inner lead portions are bent so that the end portion of the piezoelectric resonator piece is placed in the center of the thickness direction of the piezoelectric resonator.

In the above aspect of the invention, even if the case is flattened and the pressure allowance of the minor axis portion is increased, a gap size between the piezoelectric resonator piece and the inner periphery of the case is wide by the degree of bending of the inner lead portions. Therefore, since the piezoelectric resonator piece does not touch the inner periphery of the case even if it is flexed by a fall or the like, breakage or chipping of the piezoelectric resonator piece can be prevented.

In accordance with another aspect of the invention, there is provided a method for manufacturing a piezoelectric resonator in which a piezoelectric resonator piece is contained in a piezoelectric resonator container using a cylindrical case, one end of which is an open end, and a stem for sealing the open end of the case, wherein, in a cross section of the stem in a direction perpendicular to an axial direction of the case at a portion contacting the case, an outer periphery of the stem includes a minor axis portion having a first radius of curvature, and a major axis portion having a second radius of curvature smaller than the first radius of curvature, and a tangent to the first radius of curvature coincides with a tangent to the second radius of curvature at a connection portion of the first radius of curvature and the second radius of curvature, wherein, in a cross section of the case in an direction perpendicular to an axial direction of the case at a portion contacting the stem, an inner periphery of the case includes a minor axis portion having a third radius of curvature, and a major axis portion having a fourth radius of curvature smaller than the third radius of curvature, and a tangent to the third radius of curvature coincides with a tangent to the fourth radius of curvature at a connection portion of the third radius of curvature and the fourth radius of curvature, wherein a pressure allowance when pressing the stem into the open end of the case monotonically increases from the major axis of the case toward the minor axis, wherein projections abutting against the inner peripheral edge of the open end of the case which is formed as the tapered face are formed at four sections corresponding to between the major axis portion and the minor axis portion of shoulder parts located in the pressure direction, and wherein, when pressing the stem into the open end of the case, the case and the stem are relatively moved by vibrations to thereby determine positioning of the case and the stem.

In accordance with another aspect of the invention, there is provided the feature of the above aspect, wherein the vibrations are generated by an ultrasonic vibrator.

In accordance with another aspect of the invention, there is provided the feature of the above aspect, wherein the vibrations are generated by a piezoelectric element.

In accordance with another aspect of the invention, there is provided a method for manufacturing a piezoelectric resonator in which a piezoelectric resonator piece is contained in a piezoelectric resonator container using a cylindrical case, one end of which is an open end, and a stem for sealing the open end of the case, wherein, in a cross section of the stem in a direction perpendicular to an axial direction of the case at a portion contacting the case, an outer periphery of the stem includes a minor axis portion having a first radius of curvature, and a major axis portion having a second radius of curvature smaller than the first radius of curvature, and a tangent to the first radius of curvature coincides with a tangent to the second radius of curvature at a connection portion of the first radius of curvature and the second radius of curvature, wherein, in a cross section of the case in a direction perpendicular to an axial direction of the case at a portion contacting the stem, an inner periphery of the case includes a minor axis portion having a third radius of curvature, and a major axis portion having a fourth radius of curvature smaller than the third radius of curvature, and a tangent to the third radius of curvature coincides with a tangent to the fourth radius of curvature at a connection portion of the third radius of curvature and the fourth radius of curvature, and wherein a pressure allowance when pressing the stem into the open end of the case monotonically increases from the major axis of the case toward the minor axis.

In accordance with another aspect of the invention, there is provided a method for manufacturing a piezoelectric resonator in which a piezoelectric resonator piece is contained in a piezoelectric resonator container using a cylindrical case, one end of which is an open end, and a stem for sealing the open end of the case, wherein, in a cross section of the stem in a direction perpendicular to an axial direction of the case at a portion contacting the case, an outer periphery of the stem has an elliptical shape, wherein, in a cross section of the case in a direction perpendicular to an axial direction of the case at a portion contacting the stem, an inner periphery of the case has an elliptical shape, and wherein a pressure allowance when pressing the stem into the open end of the case monotonically increase from the major axis of the case toward the minor axis.

In accordance with another aspect of the invention, there is provided the feature of the above aspect, wherein the inner peripheral edge, of the open end of the case is formed into a tapered face in a cross section in the axial direction of the case, and wherein a shoulder part located in a direction of the pressing of the stem is arcuate in a cross section in the axial direction of the case, and the radius of curvature of the arc is larger at the minor axis portion than that at the major axis portion of the stem.

In accordance with another aspect of the invention, there is provided the aspect of the invention of the above aspect, wherein the inner peripheral edge of the open end of the case is formed into a tapered face in a cross section in the axial direction of the case, and wherein a shoulder part located in a pressure direction of the stem is arcuate in a cross section in the axial direction of the case, and the center position of the arc is located toward the major axis portion from the minor axis portion of the stem in the pressure direction.

In accordance with another aspect of the invention, there is provided the feature of the above aspect, wherein the inner peripheral edge of the open end of the case is formed into a tapered face in a cross section in the axial direction of the case, and an angle which the tapered face forms with the axial direction is smaller at the minor axis portion than that at the major axis portion.

In accordance with another aspect of the invention, there is provided the feature of the above aspect, wherein the inner peripheral edge of the open end of the case is formed into a tapered face in a cross section in the axial direction of the case, and the position of the tapered face in the axial direction is located toward the minor axis portion from the major axis portion of the case in the pressure direction.

In accordance with another aspect of the invention, there is provided the feature of the above aspect, wherein projections abutting against the inner peripheral edge of the open end of the case which is formed as the tapered face are formed at four sections corresponding to between the major axis portion and the minor axis portion of shoulder parts located in the pressure direction.

In accordance with another aspect of the invention, there is provided the feature of the above aspect, wherein the projections are formed by deep-drawing a metal outer ring constituting the stem.

In accordance with another aspect of the invention, there is provided the feature of the above aspects, wherein the projections are formed by solder balls.

In accordance with another aspect of the invention, there is provided the feature of the above aspects, wherein the projections are formed by thick solder plating.

In accordance with another aspect of the invention, there is provided the feature of the above aspects, wherein the thickness of the case at the major axis portion is less than the thickness at the minor axis portion.

In accordance with another aspect of the invention, there is provided the feature of any one of the above aspects, wherein, in leads fixed to the stem, inner lead portions to be superimposed on mounting portions of the piezoelectric resonator piece in the case are bent so that an end portion of the piezoelectric resonator piece is placed in the center of a thickness direction of the piezoelectric resonator.

In accordance with another aspect of the invention, there is provided the feature of any one of the above aspects, wherein, in leads fixed to the stem, diameters of inner lead portions to be superimposed on mounting portions of the piezoelectric resonator in the case are smaller than those of other lead portions.

In accordance with another aspect of the invention, there is provided the feature of any one of the above aspects, wherein, in leads fixed to the stem, inner lead portions to be superimposed on mounting portions of the piezoelectric resonator in the case are flattened.

In accordance with another aspect of the invention, there is provided the feature of the above aspects, wherein the inner lead portions are formed with projections projecting toward the outside from the flat faces of the inner lead portions.

In accordance with another aspect of the invention, there is provided the feature of the above aspects, wherein the projections are formed by solder balls.

In accordance with another aspect of the invention, there is provided the feature of the above aspect, wherein the projections are formed by thick solder plating.

In accordance with another aspect of the invention, there is provided the feature of the above aspect, wherein the projections are formed by deformed portions of the inner lead portions.

In accordance with another aspect of the invention, there is provided the feature of any one of the above aspect, wherein the inner lead portions are bent so that an end portion of the piezoelectric resonator piece is placed in the center of a thickness direction of the piezoelectric resonator.

In accordance with another aspect of the invention, there is provided the feature of the above aspects, wherein the piezoelectric resonator piece is mounted on the inner leads that are bent in advance so that the end portion of the piezoelectric resonator piece is placed in the center of the thickness direction of the piezoelectric resonator.

In accordance with another aspect of the invention, there is provided the feature of the above aspects, wherein the piezoelectric resonator piece is mounted on the inner leads while bending the inner leads so that the end portion of the piezoelectric resonator piece is placed in the center of the thickness direction of the piezoelectric resonator.

In accordance with another aspect of the invention, there is provided a circuit board having mounted thereon a piezoelectric resonator in which a piezoelectric resonator piece is contained in a piezoelectric resonator container having a cylindrical case, one end of which is an open end, and a stem for sealing the open end of the case, wherein in a cross section of the stem in a direction perpendicular to an axial direction of the case at a portion contacting the case, an outer periphery of the stem includes a minor axis portion having a first radius of curvature, and a major axis portion having a second radius of curvature smaller than the first radius of curvature, and a tangent to the first radius of curvature coincides with a tangent to the second radius of curvature at a connection portion of the first radius of curvature and the second radius of curvature, wherein, in a cross section of the case in a direction perpendicular to an axial direction of the case at a portion contacting the stem, an inner periphery of the case includes a minor axis portion having a third radius of curvature, and a major axis portion having a fourth radius of curvature smaller than the third radius of curvature, and a tangent to the third radius of curvature coincides with a tangent to the fourth radius of curvature at a connection portion of the third radius of curvature and the fourth radius of curvature, and wherein a pressure allowance when pressing the stem into the open end of the case monotonically increases from the major axis of the case toward the minor axis.

In the above aspect of the invention, since the outer periphery of the stem and the inner periphery of the case have a nearly elliptical shape formed of two type of large and small arcs, a flat piezoelectric resonator piece can be efficiently contained, and the thickness of the piezoelectric resonator can be reduced. Thus, if the piezoelectric resonator is mounted on a circuit board, the thickness of the circuit board can be reduced. Since the pressure allowance is increased at the minor axis portion where the vertical stress tends to decrease, the vertical stress is above the lower limit value over the entirety thereof. Therefore, incomplete gastightness due to inadequate sealing does not occur. Furthermore, since the pressure allowance is set to be small at the major axis portion where the tensile stress tends to increase, the tensile stress is below the upper limit value over the entirety thereof. For this reason, incomplete gas-tightness due to the breaking of the case does not occur. Therefore, according to the present invention, a piezoelectric resonator with a high degree of reliability, and a circuit board having the piezoelectric resonator mounted thereon can be constructed.

In accordance with another aspect of the invention, there is provided a circuit board having mounted thereon a piezoelectric resonator in which a piezoelectric resonator piece is contained in a piezoelectric resonator container having a cylindrical case, one end of which is an open end, and a stem for sealing the open end of the case, wherein, in a cross section of the stem in a direction perpendicular to an axial direction of the case at a portion contacting the case, an outer periphery of the stem has an elliptical shape, wherein, in a cross section of the case in a direction perpendicular to an axial direction of the case at a portion contacting the stem, an inner periphery of the case has an elliptical shape, and wherein a pressure allowance when pressing the stem into the open end of the case monotonically increases from the major axis of the case toward the minor axis.

In the above aspect of the invention, since the outer periphery of the stem and the inner periphery of the case have an elliptical shape, a flat piezoelectric resonator piece can be efficiently contained, and the thickness of the piezoelectric resonator can be reduced. Thus, if the piezoelectric resonator is mounted on a circuit board, the thickness of the circuit board can be reduced. Since the pressure allowance is set to be large at the minor axis portion where the vertical stress tends to decrease, the vertical stress is above the lower limit value over the entirety thereof. In addition, since the pressure allowance is set to be small at the major axis portion where the tensile stress tends to increase, the tensile stress is below the upper limit value over the entirety thereof. Therefore, since incomplete gas-tightness due to inadequate sealing or the breaking of the case does not occur, a piezoelectric resonator with a high degree of reliability, and a circuit board having the piezoelectric resonator mounted thereon can be constructed.

BRIEF DESCRIPTION OF THE DRAWINGS

FIGS. 27(A)–(B) include illustrations of a method for manufacturing the piezoelectric resonator according to the tenth embodiment of the present invention, in which FIG. 27(A) is a sectional view of an inner lead-bending jig on which a stem is set, and FIG. 27(B) is a sectional view of the stem in which the inner lead is bent by the inner lead-bending jig.

DETAILED DESCRIPTION OF PREFERRED EMBODIMENTS

Preferred embodiments of the present invention will now be described with reference to the drawings.

[First Embodiment]

Figure 1:
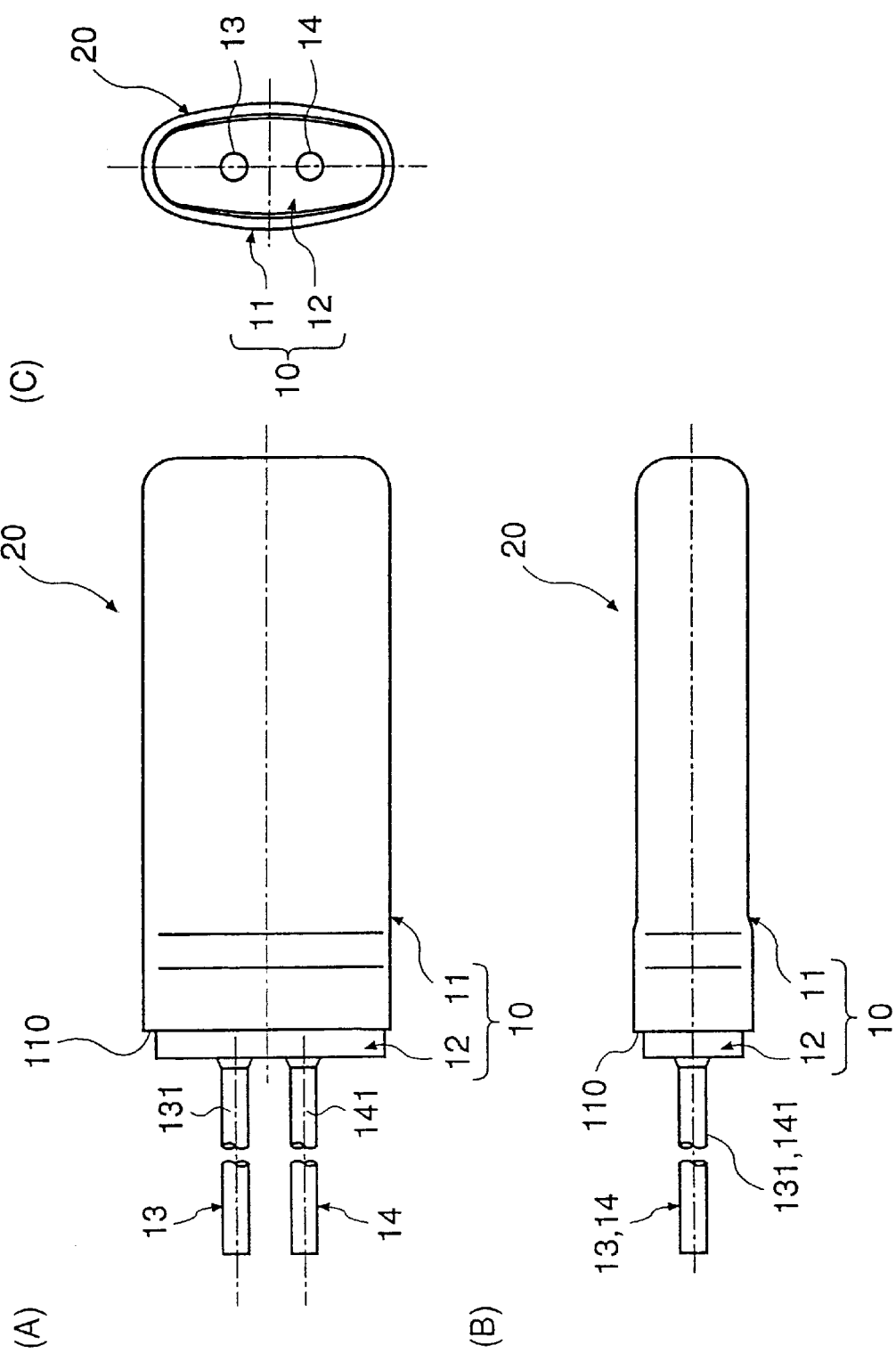
FIGS. 1(A), 1(B), and 1(C) are a plan view, a side view, and a front view, respectively, showing an overall construction of a piezoelectric resonator.
Figure 2:
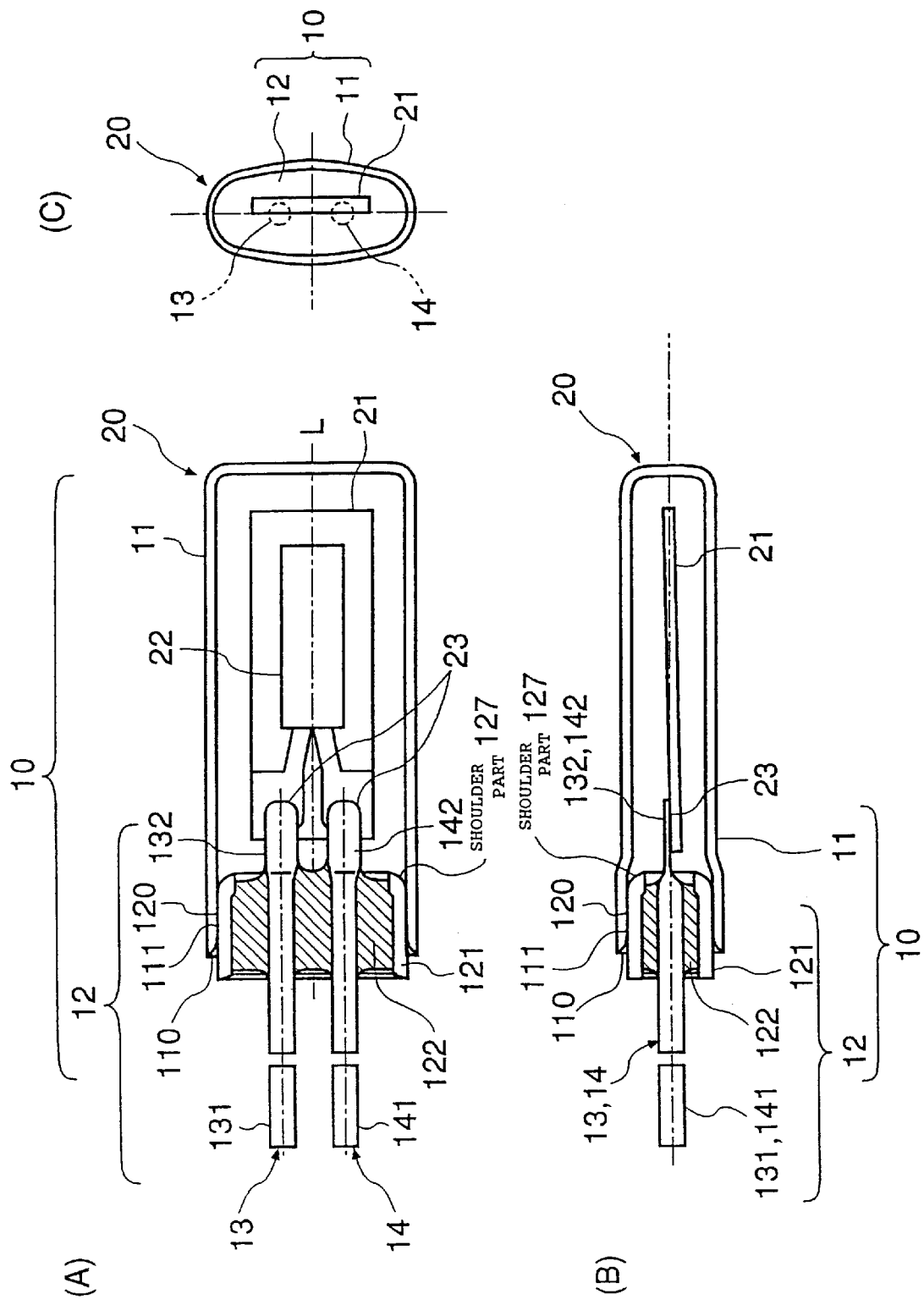
FIGS. 2(A), 2(B), and 2(C) arena sectional plan view, a sectional side view, and a section front view, respectively, showing an overall construction of a piezoelectric resonator container according to a first embodiment of the present invention.

FIGS. 1(A), 1(B), and 1(C) are a plan view, a side view, and a front view, respectively, showing an overall construction of a piezoelectric resonator. FIGS. 2(A), 2(B), and 2(C) are a sectional plan view, a sectional side view, and a sectional front view, respectively, showing the overall construction of the piezoelectric resonator.

As is apparent from FIGS. 1(A), 1(B), and 1(C), and FIGS. 2(A), 2(B), and 2(C), a piezoelectric resonator container 10 used in a piezoelectric resonator 20 consists of a cylindrical case 11, one end of which is an open end 110, and a stem 12 for sealing the open end 110 of the case 11. The case 11 is composed of a nickel-silver member having copper, zinc, and nickel as major compositions, or a forty-two alloy consisting of about 41% to 42% nickel and residual iron, and the surface thereof is treated for nickel plating having a thickness of about 10 $\mu$m or less. The stem 12 consists of a metal outer ring 121 composed of Kovar or forty-two alloy, a sealing glass 122 inserted inside the metal outer ring 121, and two leads 13 and 14 fixed to the inside of the metal outer ring 121 by the sealing glass 122, and the two leads 13 and 14 are electrically insulated from each other. The metal outer ring 121 has a copper-plated layer that is formed as a base having a thickness of about 6 $\mu$m or less, and the surface of the copper-plated layer is treated for tin-lead plating having a thickness of about 22 $\mu$m or less. In the two leads 13 and 14, one side extending toward the outside from the stem 12 forms outer lead portions 131 and 141, and portions extending toward the inside of the case 11 are inner lead portions 132 and 142. These leads 13 and 14 are obtained by forming a copper-plated layer having a thickness of about 6 $\mu$m or less as a base layer on a surface of metal, such as Kovar or forty-two alloy, and by plating solder of high melting point having a thickness of about 22 $\mu$m or less on the surface of the copper-plated layer. The sealing glass 122 is Kovar glass, which is similar to Kovar, having a thermal expansion coefficient of from about $4 \times 10^{-6}/C.°$ to about $6 \times 10^{-6}/C.°$.

In the piezoelectric resonator 20, a predetermined electrode pattern 22 is formed on a thin plate piezoelectric resonator piece 21 that is formed of an AT cut quartz crystal piece, and portions corresponding to the base of the piezoelectric resonator piece 21 are mounting portions 23. To the mounting portions 23, the above-described inner lead portions 132 and 142 are connected by a conductive adhesive agent or solder, whereby the piezoelectric resonator piece 21 is held to the stem 12 in a predetermined orientation.

In the thus-constructed piezoelectric resonator container 10, the stem 12 is attached to the open end 110 of the case 11 in such a manner that the piezoelectric resonator piece 21 fixed to the leads 13 and 14 is inserted into the case 11. Here, since the inner diameter size of the case 11 at the open end 110 is set to be smaller than the outer diameter size of the stem 12 over the entirety thereof, if the stem 12 is pressed into the open end 110 of the case 11, the open end 110 of the case 11 is sealed by the stem 12 by vertical stress according to a pressure allowance (difference between the inner diameter size of the case 11 and the outer diameter size of the stem 12).

In such a sealing process, the case 11 and the stem 12 are attached to a tool (not shown) that is preheated at a temperature slightly lower than the solidus of solder, and then the tool is put into a vacuum furnace or an atmosphere of nitrogen gas to remove gas adhered to and adsorbed on the case 11, stem 12, and piezoelectric resonator piece 21. Next, the stem 12 is pressed into the open end 110 of the case 11 in a vacuum atmosphere. In this case, while the solder formed on the surface of the metal outer ring 121 of the stem 12 is in a solid state, it is softened because it is heated to a temperature near the solid phase point. Therefore, if the stem 12 is pressed into the open end 110 of the case 11 in this state, the solder fills up the gap between the case 11 and the stem 12 to securely seal the open end 110.

Figure 3:
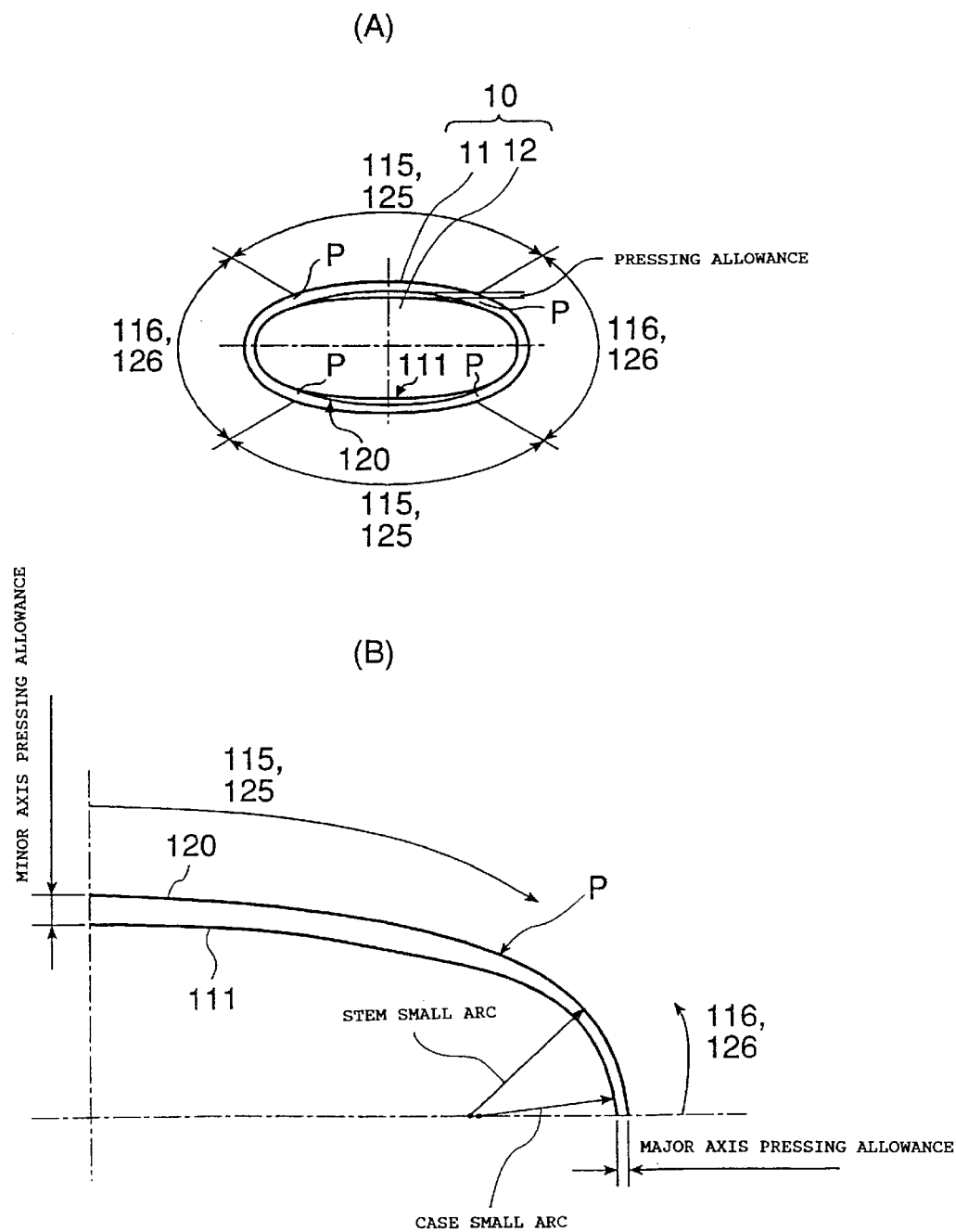
FIG. 3(A) is an illustration showing a comparison of the size of the inner peripheral surface of a case and the size of the outer peripheral surface of a stem in the piezoelectric resonator container according to the first embodiment of the present invention.
FIG. 3(B) is a partially enlarged illustration of FIG. 3(A).

FIG. 3(A) is an illustration showing a comparison of the size of the inner peripheral surface of the case and the size of the outer peripheral surface of the stem in the piezoelectric resonator container 10 of this embodiment, and FIG. 3(B) is a partially enlarged illustration of FIG. 3(A).

In this embodiment, in order to efficiently contain the thin plate piezoelectric resonator piece 21 in the piezoelectric resonator container 10, and to reduce the thickness of the piezoelectric resonator container 10, the piezoelectric resonator container 10 does not have a cylindrical cross-sectional configuration, but instead as a nearly elliptical cross-sectional configuration, as shown in FIGS. 3(A) and 3(B). That is, in a cross section in the direction perpendicular to the direction of an axis L of the case 11 at a portion where the stem 12 contacts the case 11, an outer periphery 120 of the stem 12 has a nearly elliptical shape (double-arc configuration) which includes a minor axis portion 125 having the first radius of curvature, and a major axis portion 126 having the second radius of curvature smaller than the first radius of curvature. Therefore, the outer periphery 120 of the stem 12 has a shape such that a large arc portion equivalent to the minor axis portion 125 and a small arc portion equivalent to the major axis portion 126 are arranged alternately, and is symmetric with respect to the minor axis and the major axis. Here, a point where the large arc portion and the small arc portion are connected is a connection point P, and a tangent to the large arc portion coincides with a tangent to the small arc portion at the connection point P. For this reason, in the outer peripheral shape of the stem 12, the large arc portion and the small arc portion are smoothly connected, and there is no corner portion.

In a cross section in the direction perpendicular to the direction of the axis L of the case 11 at a portion where the case 11 contacts the stem 12, an inner periphery 111 of the case 11 has a nearly elliptical shape which includes a minor axis portion 115 having the third radius of curvature, and a major axis portion 116 having the fourth radius of curvature smaller than the third radius of curvature. Therefore, the inner periphery 111 of the case 11 also has a shape such that a large arc portion equivalent to the minor axis portion 125 and a small arc portion equivalent to the major axis portion 126 are arranged alternately, and is symmetric with respect to the minor axis and the major axis. Here, at the position equivalent to the connection point P where the large arc portion and the small arc portion are connected, a tangent to the large arc portion coincides with a tangent to the small arc portion. For this reason, in the inner peripheral shape of the case 11, the large arc portion and the small arc portion are smoothly connected, and there is no corner portion.

In the thus-constructed piezoelectric resonator container 10, in a state where the stem 12 is pressed into the case 11, in the cross section in the direction perpendicular to the direction of the axis L of the case 11, the size in the direction of the major axis is about 3.5 mm or less, and the size in the direction of the minor axis is from about one-quarter to about two-thirds of the size in the direction of the major axis.

In this embodiment, in the thus-constructed piezoelectric resonator container 10, the pressure allowance when pressing the stem 12 into the open end 110 of the case 11 monotonically increases from the major axis portions 116 and 126 of the case 11 and the stem 12 toward the minor axis portions 115 and 125. The pressure allowance is strictly defined as the size between the inner periphery 111 of the case 11 and the outer periphery 120 of the stem 12 in the direction of a normal line of the outer peripheral surface of the stem 12. Here, the size of the pressure allowance in the major axis portions 116 and 126 of the case 11 and the stem 12 is about 0.03 mm or less, and the size of the pressure allowance in the minor axis portions 115 and 125 of the case 11 and the stem 12 is within the range of about 0.02 mm to 0.06 mm. Under such conditions, the pressure allowance is set to monotonically increase from the major axis portions 116 and 126 of the case 11 and the stem 12 toward the minor axis portions 115 and 125.

Figure 4:
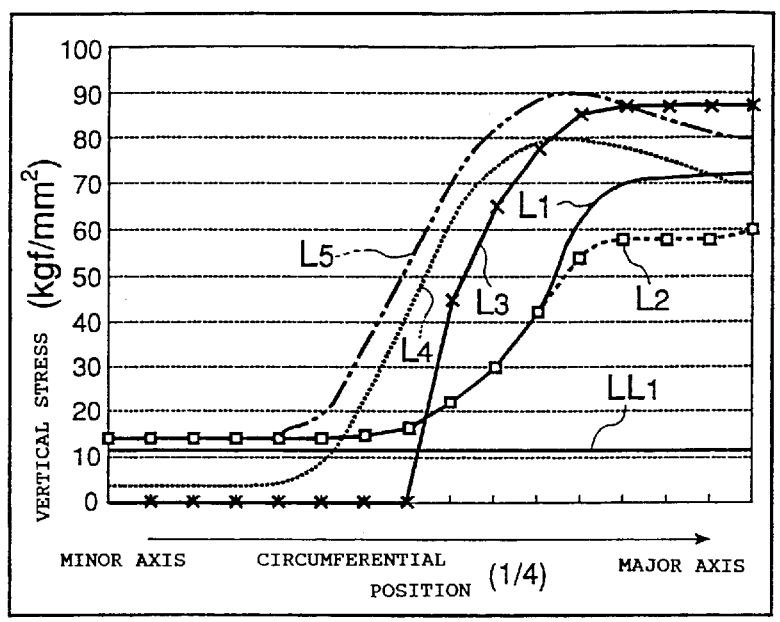
FIGS. 4(A) and 4(B) are graphs showing results of calculations of vertical stress and tensile stress of a piezoelectric resonator container to which the present invention is applied, and those of piezoelectric resonators according to comparative examples, respectively.
FIG. 4(C) is an illustration showing directions of the stresses.
Figure 4:
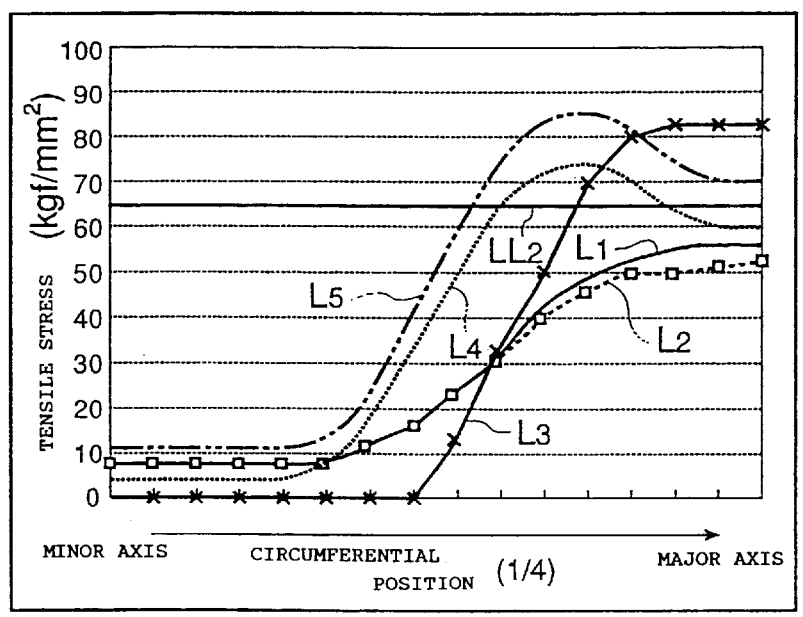
Figure 4:
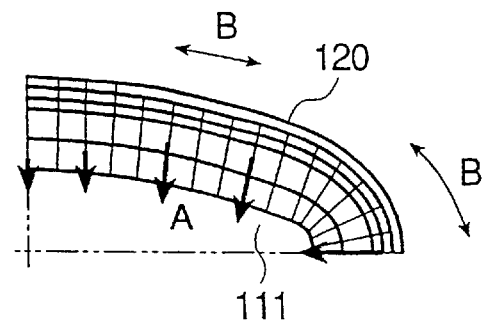

FIGS. 4(A) and 4(B) show results of calculations of vertical stress and tensile stress when the stem 12 is pressed into the case 11 regarding the thus-constructed piezoelectric resonator container 10 and piezoelectric resonator containers according to comparative examples. The vertical stress is stress in the direction shown by the arrows A in FIG. 4(C). Therefore, the larger the vertical stress (contact surface pressure after pressing), the higher the sealing ability obtained. The tensile stress is stress shown by the arrows B in FIG. 4(C), and is equivalent to stress for breaking the case 11 in the circumferential direction. Therefore, the larger the tensile strength, the easier an excessive force may be applied to the case 11, breaking the case 11, so that incomplete gas-tightness easily occurs.

In FIGS. 4(A) and 4(B), the solid line L1 shows the results of measurements regarding the piezoelectric resonator container 10 according to this embodiment. The symbols x and the solid line L3 show the results of measurements regarding the piezoelectric resonator container according to the first comparative example, and a case 11 and a stem 12 each having an elliptical cross-sectional configuration (track shape) are used in the piezoelectric resonator container according to the first comparative example. The dotted line L4 and the two-dot chain line L5 show results of measurements regarding the piezoelectric resonator containers according to the second and the third comparative examples, respectively. In the piezoelectric resonator according to the second and third comparative examples, there is a maximum pressure allowance between the major axis portion 126 and the minor axis portion 125. The solid line LL1 in FIG. 4(A) shows the lower limit value of the vertical stress. The solid line LL2 in FIG. 4(B) shows the upper limit value of the tensile stress.

As is apparent from FIG. 4(A), in the piezoelectric resonator container 10 according to this embodiment shown by the solid line L1, since the pressure allowance is set to be large at the minor axis portions 115 and 125 where the vertical stress tends to decrease, the vertical stress is above the lower limit value over the entirety thereof. Therefore, incomplete gas-tightness due to inadequate sealing does not occur. As is apparent from FIG. 4(B), in the piezoelectric resonator container according to this embodiment shown by the solid line L1, since the pressure allowance is set to be small at the major axis portions 116 and 126 where the tensile stress tends to increase, the tensile stress is below the upper limit value over the entirety thereof. For this reason, incomplete gas-tightness due to the breaking of the case 11 does not occur. Therefore, according to this embodiment, the piezoelectric resonator 20 with a high degree of reliability can be constructed.

In contrast, in the piezoelectric resonator containers according to the comparative examples, it will be understood that it is difficult to have the vertical stress and the tensile stress to fall within allowable ranges.

[Second Embodiment]

Figure 5:
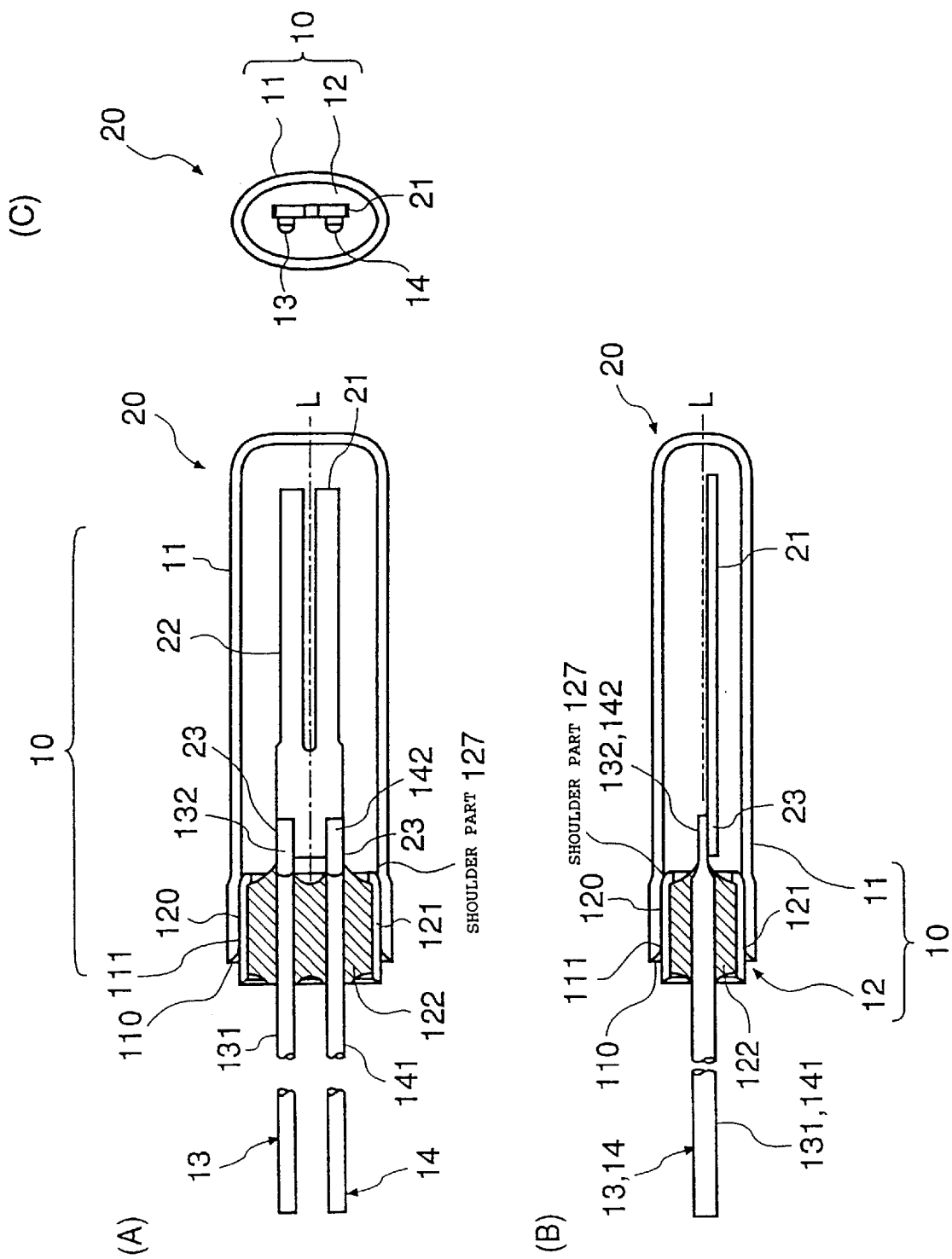
FIGS. 5(A), 5(B), and 5(C) are a sectional plan view, a sectional side view, and a sectional front view, respectively, showing the overall construction of a piezoelectric resonator container according to a second embodiment of the present invention.
Figure 6:
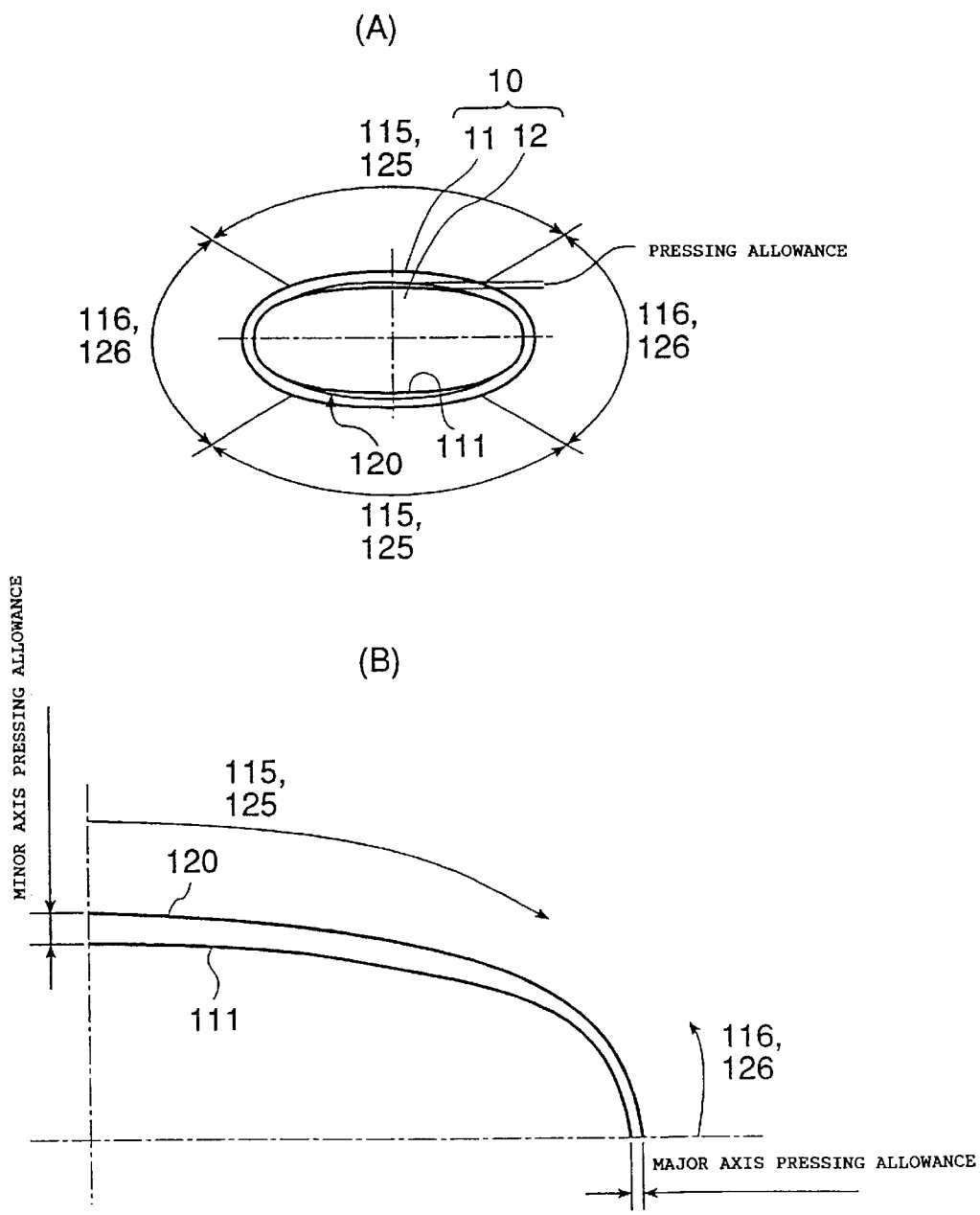
FIG. 6(A) is an illustration showing a comparison of the size of the inner peripheral surface of a case and the size of the outer peripheral surface of a stem in the piezoelectric resonator container according to the second embodiment of the present invention.
FIG. 6(B) is a partially enlarged illustration of FIG. 6(A).

FIGS. 5(A), 5(B), and 5(C) are a sectional plan view, a sectional side view, and a sectional front view, respectively, showing an overall construction of a piezoelectric resonator. FIG. 6(A) is an illustration showing a comparison of the size of the inner peripheral surface of a case and the size of the outer peripheral surface of a stem in a piezoelectric resonator container 10 of this embodiment, and FIG. 6(B) is a partially enlarged illustration of FIG. 6(A). Since the basic construction, such as the external shape, is common to that of the first embodiment, corresponding parts are indicated by the same reference numerals and a detailed description thereof will be omitted.

As is apparent from FIGS. 5(A), 5(B), and 5(C), the piezoelectric resonator container 10 of this embodiment also consists of a cylindrical case 11, one end of which is an open end 110, and a stem 12 for sealing the open end 110 of the case 11. The stem 12 consists of a metal outer ring 121, a sealing glass 122 inserted inside the metal outer ring 121, and two leads 13 and 14 fixed to the inside of the metal outer ring 121 by the sealing glass 122, and the two leads 13 and 14 are electrically insulated from each other. In the two leads 13 and 14, one side extending toward the outside from the stem 12 forms outer lead portions 131 and 141, and portions extending toward the inside of the case 11 are inner lead portions 132 and 142.

In a piezoelectric resonator 20, a predetermined electrode pattern (not shown) is formed on a thin plate piezoelectric resonator piece 21 consisting of a quartz crystal piece that is cut in the shape of a tuning fork, and portions corresponding to the base of the piezoelectric resonator piece 21 are mounting portions 23. To the mounting portions 23, the inner lead portions 132 and 142 are connected by a conductive adhesive agent or solder, whereby the piezoelectric resonator piece 21 is held to the stem 12 in a predetermined orientation.

In the thus-constructed piezoelectric resonator container 10, since the inner diameter size of the case 11 is also set to be smaller than the outer diameter size of the stem 12 in this embodiment, if the stem 12 is pressed into the open end 110 of the case 11, the open end 110 of the case 11 is sealed by the stem 12 by vertical stress according to a pressure allowance (difference between the inner diameter size of the case 11 and the outer diameter size of the stem 12).

In the thus-constructed piezoelectric resonator 20, in order to efficiently contain the thin plate piezoelectric resonator piece 21, and to reduce the thickness of the piezoelectric resonator container 10, the piezoelectric resonator container 10 of this embodiment does not have a cylindrical cross-sectional configuration, but instead has a an elliptical crosssectional configuration, as shown in FIGS. 6(A) and 6(B). That is, in a cross section in the direction perpendicular to the direction of an axis L of the case 11 at a portion where the stem 12 contacts the case I1, an outer periphery 120 of the stem 12 has an elliptical shape. Therefore, the outer periphery 120 of the stem 12 has a shape such that a minor axis portion 125 and a major axis portion 126 are arranged alternately, and is symmetric with respect to the minor axis and the major axis.

In a cross section in the direction perpendicular to the direction of the axis L of the case 11 at a portion where the case 11 contacts the stem 12, an inner periphery 111 of the case 11 has an elliptical shape. Therefore, the inner periphery 111 of the case 11 also has a shape such that a minor axis portion 115 and a major axis portion 116 are arranged alternately, and is symmetric with respect to the minor axis and the major axis.

In the thus-constructed piezoelectric resonator container 10, in a state where the case 11 is pressed into the stem 12, in the cross section in the direction perpendicular to the direction of the axis L of the case 11, the size in the direction of the major axis is about 3.5 mm or less, and the size in the direction of the minor axis is from about one-quarter to about two-thirds of the size in the direction of the major axis.

In this embodiment, the pressure allowance for pressing the stem 12 into the open end 110 of the case 11 also monotonically increases from the major axis portions 116 and 126 of the case 11 and the stem 12 toward the minor axis portions 115 and 125. Here, the size of the pressure allowance in the major axis portions 116 and 126 of the case 11 and the stem 12 is about 0.03 mm or less, and the size of the pressure allowance in the minor axis portions 115 and 125 of the case 11 and the stem 12 is within the range of about 0.02 mm to 0.06 mm. Under such conditions, the pressure allowance is set to monotonically increase from the major axis portions 116 and 126 of the case 11 and the stem 12 toward the minor axis portions 115 and 125.

Results of calculations of vertical stress and tensile stress regarding the thus-constructed piezoelectric resonator container 10 are characteristics shown by the solid line L1 in FIGS. 4(A) and 4(B), similarly to the results of calculations in the first embodiment. That is, as is apparent from FIG. 4(A), in the piezoelectric resonator container 10 according to this embodiment shown by the solid line L1, since the pressure allowance is set to be large at the minor axis portion 125 where the vertical stress tends to decrease, the vertical stress is above the lower limit value over the entirety thereof. As is apparent from FIG. 4(B), in the piezoelectric resonator container 10 according to this embodiment shown by the solid line L1, since the pressure allowance is set to be small at the major axis portion 126 where the tensile stress tends to increase, the tensile stress is below the upper limit value over the entirety thereof. Therefore, in the piezoelectric resonator container 10 according to this embodiment, incomplete gas-tightness due to inadequate sealing or the breaking of the case 11 does not occur.

[First Modification of First and Second Embodiments]

Figure 7:
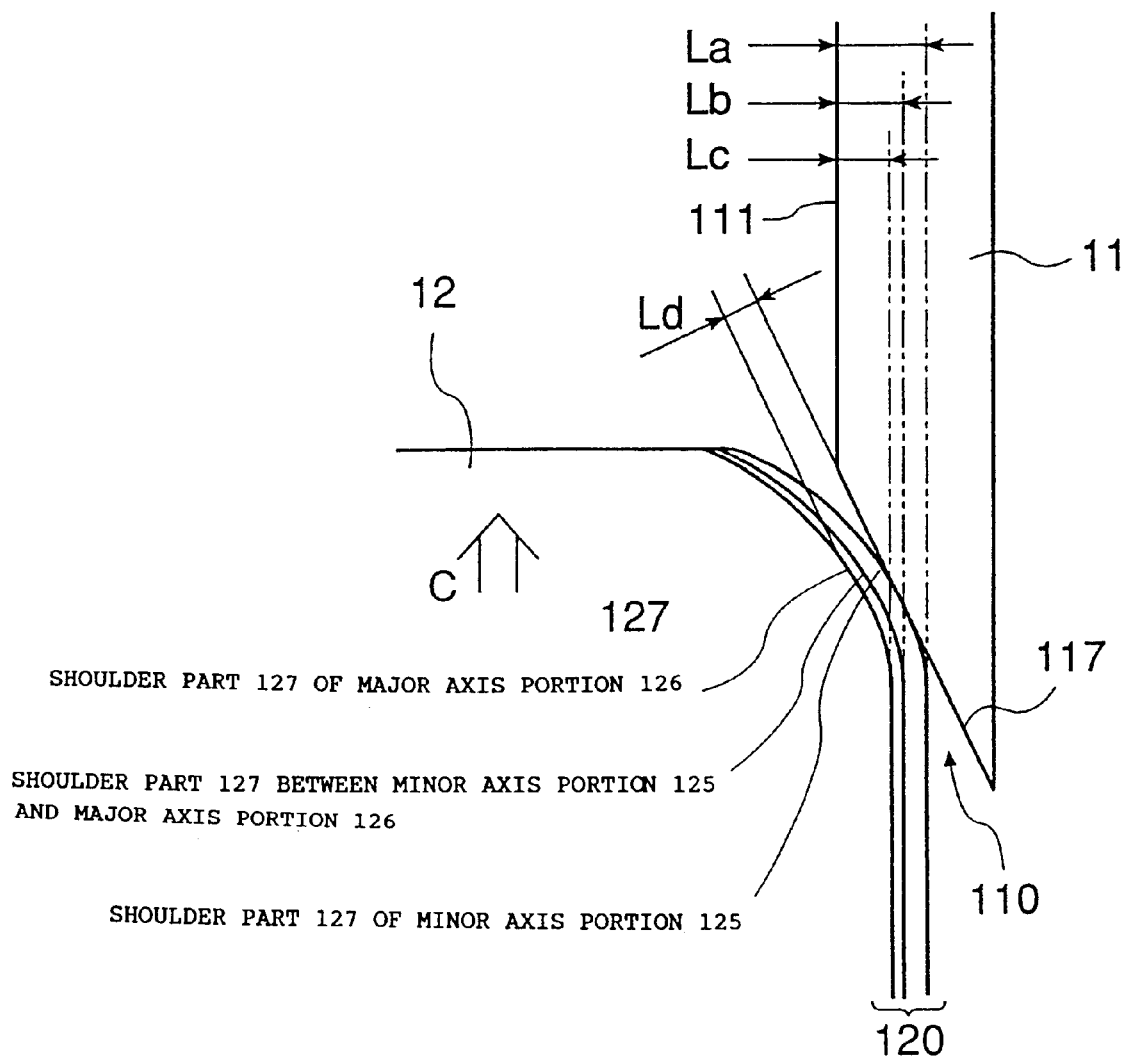
FIG. 7 is an illustration of a sealed portion of a piezoelectric resonator container for the explanation of points to be further modified in the piezoelectric resonator container according to the first and second embodiments of the present invention.
Figure 8:
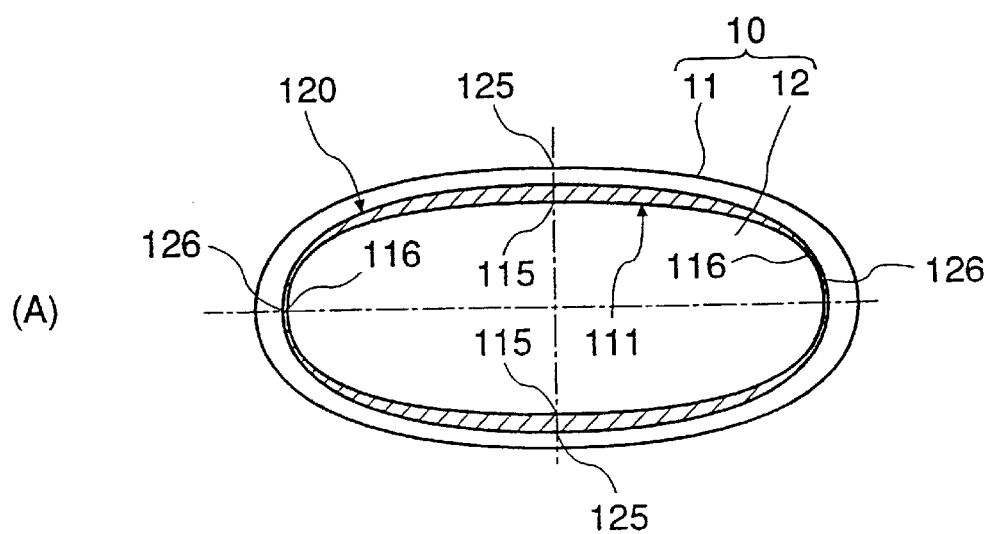
FIGS. 8(A) and 8(B) are illustrations each showing the positions of the case and the stem in relation to each other for the explanation of points to be further modified in the piezoelectric resonator container according to the first and second embodiments of the present invention.
Figure 8:
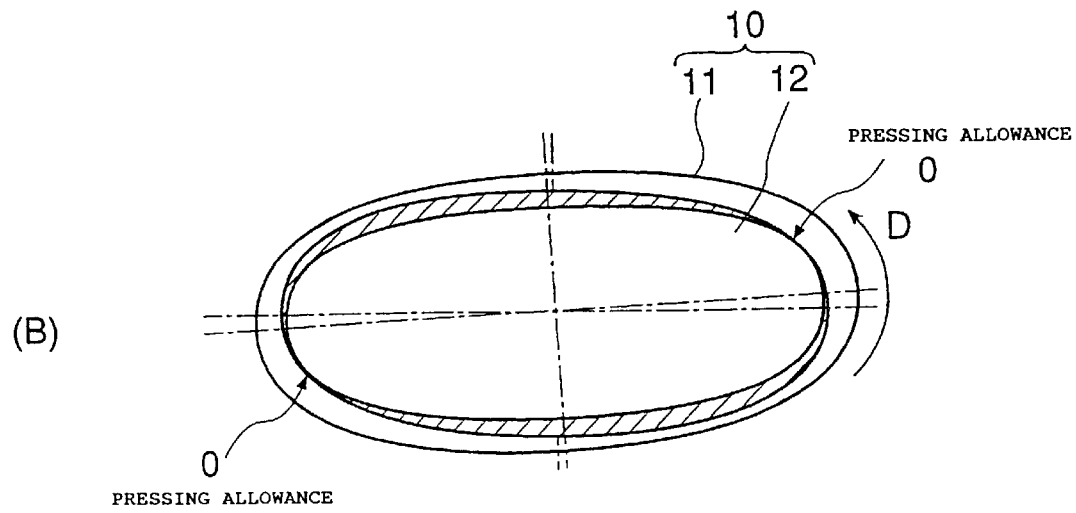
Figure 9:
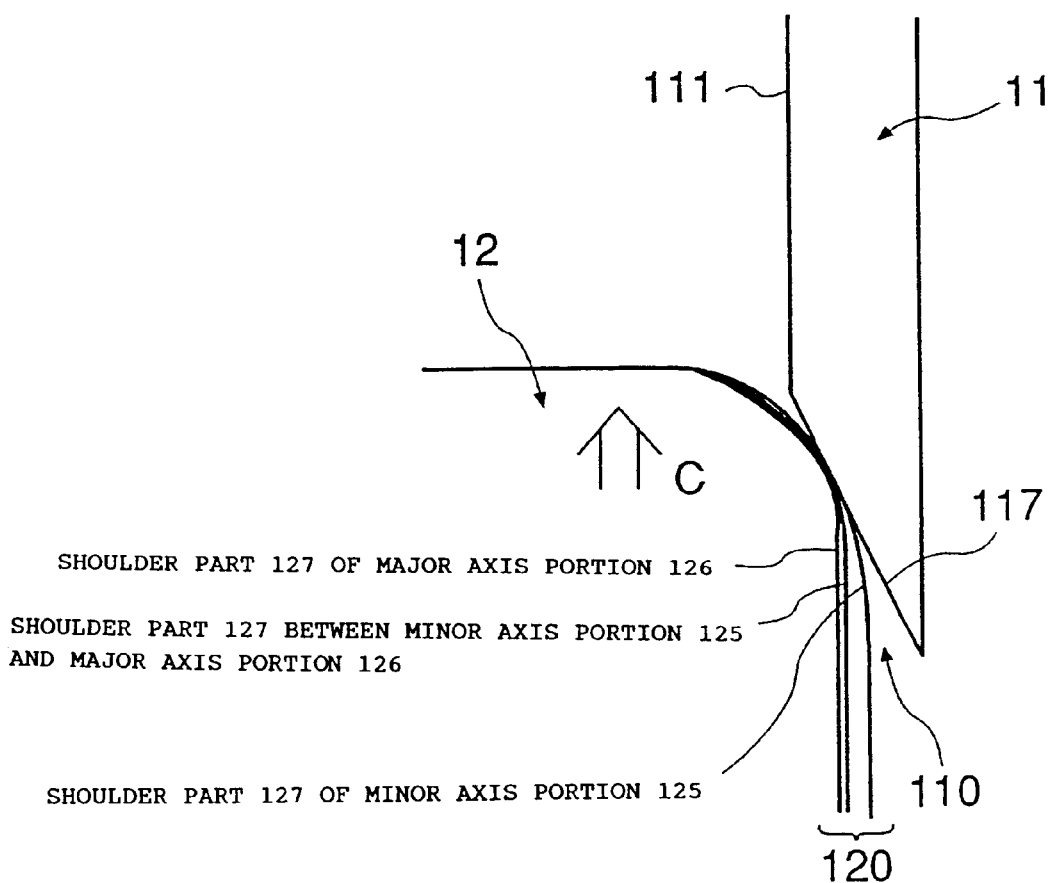
FIG. 9 is an illustration of a sealed portion of a piezoelectric resonator according to a first modification of the first and second embodiments of the present invention.

FIGS. 7 and 8(A)–(B) are illustrations for the explanation of a modification of the piezoelectric resonator containers according to the first and second embodiments, and FIG. 9 is an illustration of a sealed portion of the piezoelectric resonator container 10 in this modification. In FIGS. 7 and 9, the case 11 is shown as a common part, and shoulder parts at respective positions in the stem 12 are superimposed so that the positions of shoulder parts in the stem 12 in relation to the position of the case 1 corresponding thereto can be easily compared.

As shown in FIG. 7, in the piezoelectric resonator container 10 according to the first and second embodiments, the inner peripheral edge of the open end 110 of the case 11 is formed into a tapered face 117 so that the stem 12 can be easily pressed thereinto. A shoulder part 127 located in the pressure direction of the stem 12 (shown by the arrow C) is arcuate in a cross section in the axial direction of the case 11. A pressure allowance for pressing the stem 12 into the open end 110 of the case 11 monotonically increases, such as the sizes Lc, Lb, and La, from the major axis toward the minor axis of the case 11. For this reason, when the stem 12 is pressed into the open end 110 of the case 11, a shoulder part 127 of the minor axis portion 125, a shoulder part 127 between the minor axis portion 125 and the major axis portion 126, and a shoulder part 127 of the major axis portion 126 come into contact with the tapered face 117 of the case 11 in that order. Therefore, when the stem 12 is registered at the open end 110 of the case 11 before pressing the stem 12 thereinto, only the shoulder part 127 of the minor axis portion 125 of the stem 12 abuts against the tapered face 117 of the case 11. In such a state, a gap Ld is formed between the tapered face 117 of the case 11 and the shoulder part 127 of the major axis portion 126 of the stem 12. Therefore, the case 11 and the stem 12, which should be registered in a state where the major axis portion 116 of the case 11 and the major axis portion 126 of the stem 12 are located at the same angular position, and the minor axis portion 115 of the case 11 and the minor axis portion 125 of the stem 12 are located at the same angular position, as shown in FIG. 8(A), may be displaced from each other in the direction shown by the arrow D in FIG. 8(B). When such a displacement occurs, a portion having no pressure allowance is produced where incomplete gas-tightness occurs.

Thus, in this modification, as shown in FIG. 9, the radius of curvature of the arc of the shoulder part 127 is set so that it is small at the major axis portion 126 of the stem 12, and is large at the minor axis portion 125. Therefore, the shoulder part 127 tends to project at the major axis portion 126 of the stem 12. Therefore, when the stem 12 is registered at the open end 110 of the case 11, the shoulder part 127 of the minor axis portion 125 of the stem 12, the shoulder part 127 between the minor axis portion 125 and the major axis portion 126, and the shoulder part 127 of the major axis portion 126 abut against the tapered face 117 of the open end 110 of the case 11 at about the same time. That is, the shoulder parts 127 abut against the tapered face 117 over the entire stem 12.

In such a state, since the displacement, such as that shown in FIG. 8(B), does not occur between the case 11 and the stem 12, the case 11 and the stem 12 are registered so that the minor axis portions 115 and 125 and the major axis portions 116 and 126 correspond to one another, as shown in FIG. 8(A), and the displacement does not occur between the case 11 and the stem 12. Therefore, since a portion having no pressure allowance is not produced between the case 11 and the stem 12, incomplete gas-tightness does not occur.

[Second Modification of First and Second Embodiments]

Figure 10:
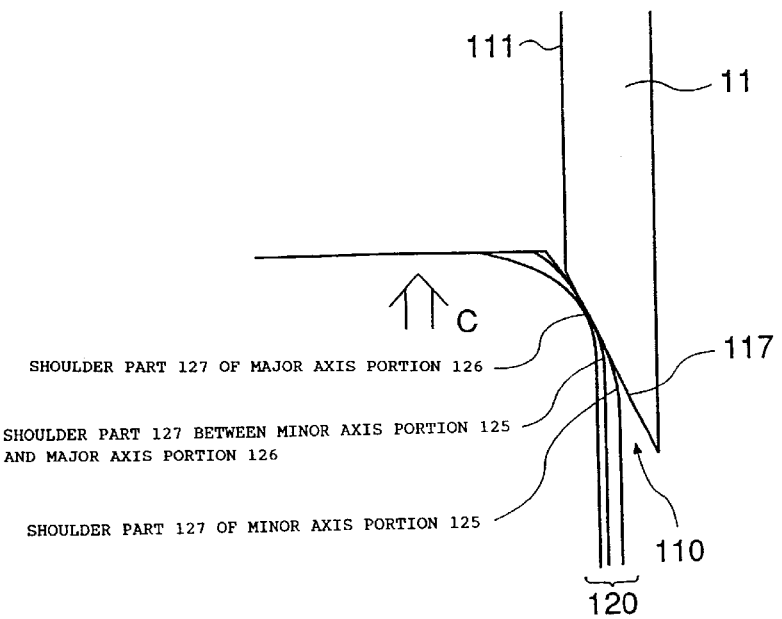
FIG. 10 is an illustration of a sealed portion of a piezoelectric resonator container according to a second modification of the first and second embodiments of the present invention.

FIG. 10 is an illustration of a sealed portion of a piezoelectric resonator container 10 of this modification. In FIG. 10, a case 11 is shown as a common part, and shoulder parts at respective positions in a stem 12 are superimposed so that the positions of shoulder parts in the stem 12 in relation to the position of the case 11 corresponding thereto can be easily compared.

In solving the problem (see FIG. 7 and FIG. 8(B)) described in the first modification, a shoulder part 127 located in the pressure direction of the stem 12 (direction shown by the arrow C) may be constructed so that it is arcuate in a cross section in the direction of the axis L of the case 11, and the center position of the arc is located toward the major axis portion 126 from the minor axis portion 125 of the stem 12 in the pressure direction (direction shown by the arrow C).

With this construction, when the stem 12 is registered at an open end 110 of the case 11, the shoulder part 127 of the minor axis portion 125, the shoulder part 127 between the minor axis portion 125 and the major axis portion 126, and the shoulder part 127 of the major axis portion 126 abut against a tapered face 117 of the open end 110 of the case 11 at about the same time. That is, the shoulder parts 127 abut against the tapered face 117 over the entirety of the stem 12. Therefore, since the displacement, such as that shown in FIG. 8(B), does not occur between the case 11 and the stem 12, the case 1 and the stem 12 are registered so that the minor axis portions 115 and 125 and the major axis portions 116 and 126 correspond to one another, as shown in FIG. 8(A). Therefore, since a portion having no pressure allowance is not generated between the case 11 and the stem 12, incomplete gas-tightness does not occur.

[Third Modification of First and Second Embodiments]

Figure 11:
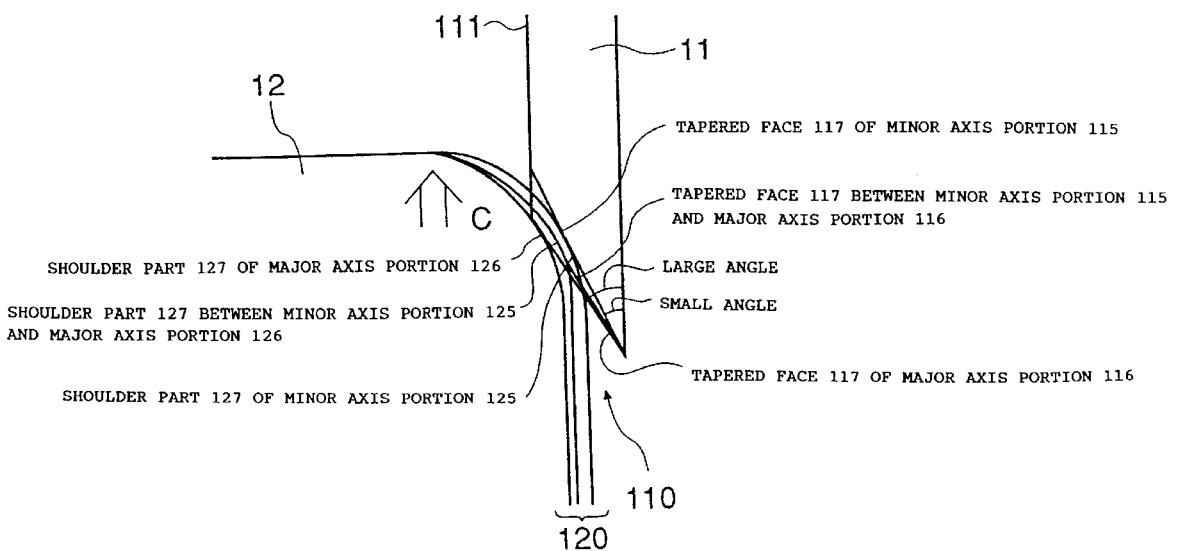
FIG. 11 is an illustration of a sealed portion of a piezoelectric resonator container according to a third modification of the first and second embodiments of the present invention.

FIG. 11 is an illustration of a sealed portion of a piezoelectric resonator container 10 of this modification. In FIG. 11, tapered faces at respective positions of a case 11 and shoulder parts at respective positions in a stem 12 are superimposed so that the positions of the shoulder parts in the stem 12 in relation to the position of the case 11 corresponding thereto can be easily compared.

In solving the problem (see FIG. 7 and FIG. 8(B)) described in the first modification, in an open end 110 of the case 11, an inner peripheral edge may be formed into a tapered face 117 in a cross section in the axial direction of the case 11, and an angle which the tapered face 117 forms with the axial direction may be smaller at the minor axis portion 115 than that at the major axis portion 116, as shown in FIG. 11. That is, although shoulder parts 127 of the stem 12 are equal in curvature over the entirety thereof, and the length of the case 11 is the same over the entirety thereof, the angle of the tapered face 11 of the case 11 is small at the minor axis portion 115.

Therefore, when the stem 12 is registered at the open end 110 of the case 11, the shoulder part 127 of the minor axis portion 125 of the stem 12, the shoulder part 127 between the minor axis portion 125 and the major axis portion 126, and the shoulder part 127 of the major axis portion 126 abut against the tapered face 117 of the open end 110 of the case 11 at about the same time. That is, the shoulder parts 127 abut against the tapered face 117 over the entirety of the stem 12. Therefore, since the displacement such as shown in FIG. 8(B) does not occur between the case 11 and the stem 12, the case 11 and the stem 12 are registered so that the minor axis portions 115 and 125 and the major axis portions 116 and 126 correspond to one another, as shown in FIG. 8(A). Thus, since a portion having no pressure allowance is not produced between the case 11 and the stem 12, incomplete gas-tightness does not occur.

[Fourth Modification of First and Second Embodiments]

Figure 12:
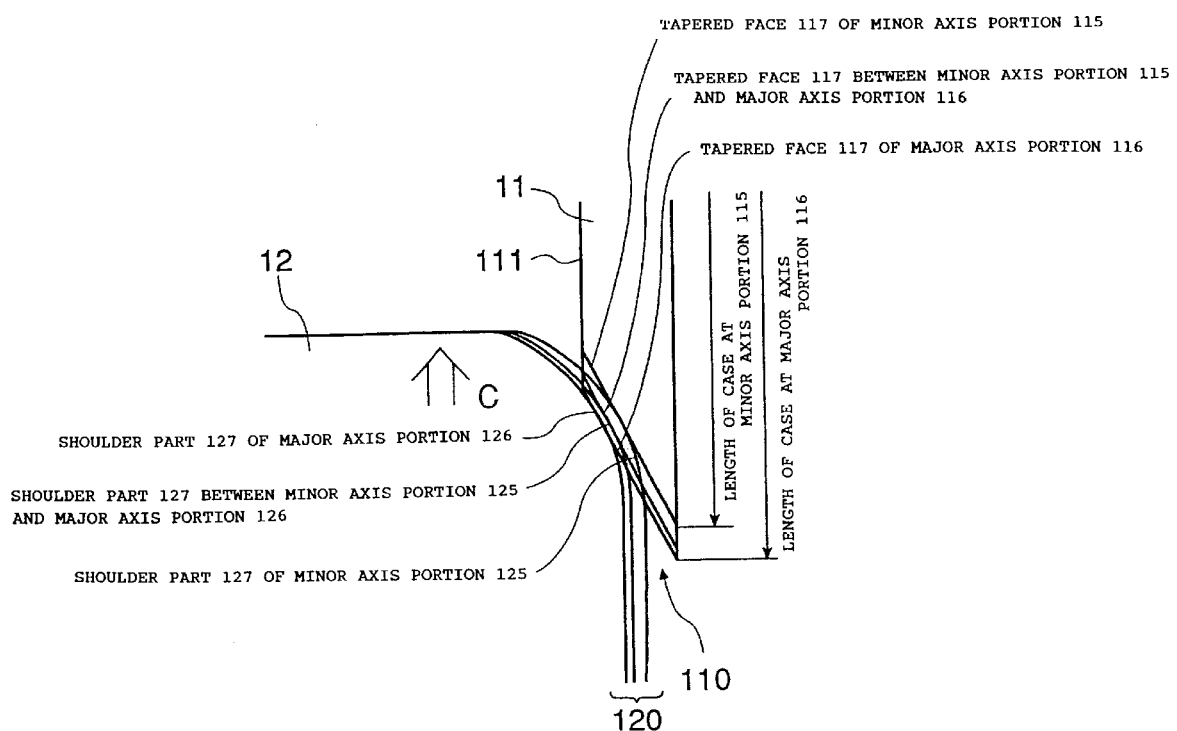
FIG. 12 is an illustration of a sealed portion of a piezoelectric resonator container according to a fourth modification of the first and second embodiments of the present invention.

FIG. 12 is an illustration of a sealed portion of a piezoelectric resonator container 10 of this modification. In FIG. 12, tapered faces at respective positions of a case 11 and shoulder parts at respective positions in a stem 12 are superimposed so that the positions of the shoulder parts in the stem 12 in relation to the position of the case 11 corresponding thereto can be easily compared.

In solving the problem (see FIG. 7 and FIG. 8(B)) described in the first modification, in an open end 110 of the case 11, an inner peripheral edge may be formed into a tapered face 117 in a cross section in the direction of the axis L of the case 11, and the tapered face 117 in the direction of the axis L may be located toward the minor axis portion 115 from the major axis portion 116 of the case 11 in the pressure direction (direction shown by the arrow C), as shown in FIG. 12. That is, although the curvature of a shoulder part 127 of the stem 12 is equal over the entirety thereof and the inclination of the tapered face 117 of the case 11 is equal over the entirety thereof, the length of the case 11 at the minor axis portion 115 is shorter than that at the major axis portion 116.

Therefore, when the stem 12 is registered in the open end 110 of the case 11, the shoulder part 127 of the minor axis portion 125, the shoulder part 127 between the minor axis portion 125 and the major axis portion 126, and the shoulder part 127 of the major axis portion 126 abut against the tapered face 117 of the open end 110 of the case 11 at about the same time. That is, the shoulder parts 127 abut against the tapered face 117 over the entirety of the stem 12. Therefore, since the displacement such as shown in FIG. 8(B) does not occur between the case 11 and the stem 12, the case 11 and the stem 12 are A registered so that the minor axis portions 115 and 125 and the major axis portions 116 and 126 correspond to one another, as shown in FIG. 8(A). Thus, since a portion having no pressure allowance is not generated between the case 11 and the stem 12, incomplete gas-tightness does not occur.

[Fifth Modification of First and Second Embodiments]

Figure 13:
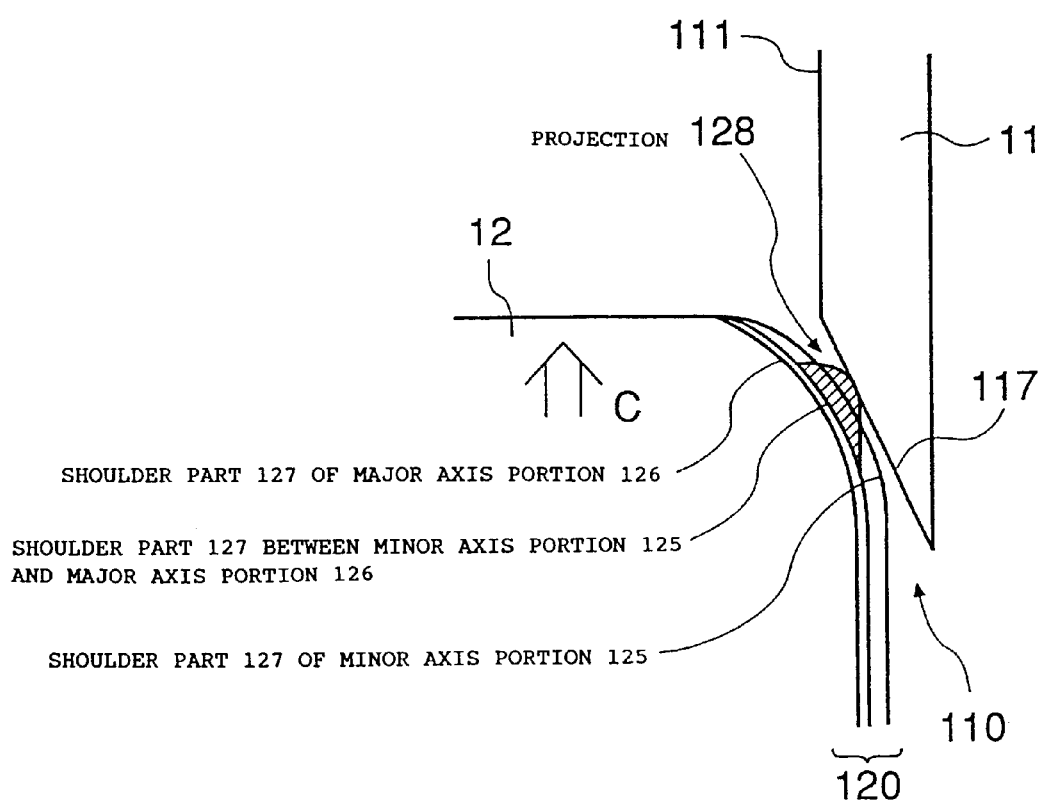
FIG. 13 is an illustration of a sealed portion of a piezoelectric resonator container according to a fifth modification of the first and second embodiments of the present invention.
Figure 14:
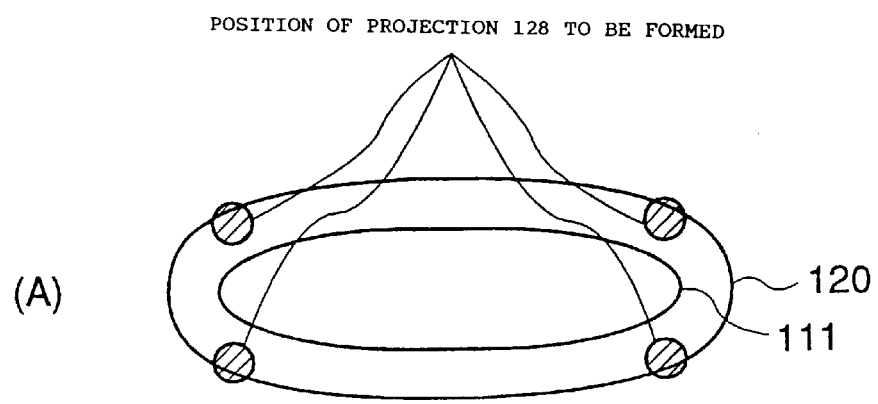
FIGS. 14(A) and 14(B) are illustrations showing a position where a projection shown in FIG. 13 is to be formed in the piezoelectric resonator containers according to the first and second embodiments, respectively.
Figure 14:
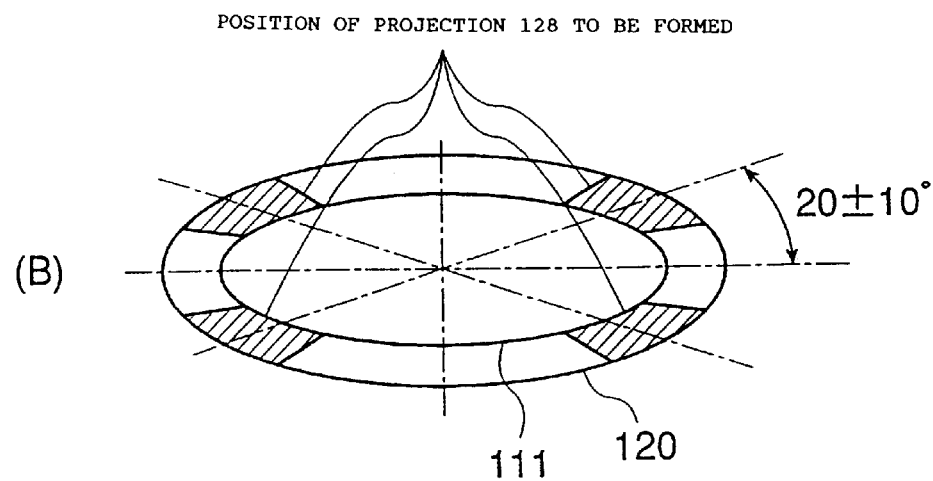

FIG. 13 is an illustration of a sealed portion of a piezoelectric resonator container of this modification. FIGS. 14(A) and 14(B) are illustrations showing a position where a projection shown in FIG. 13 is to be formed in the piezoelectric resonator containers according to the first and second embodiments of the present invention, respectively.

In solving the problem (see FIG. 7 and FIG. 8(B)) described in the first modification, in an open end 110 of the case 11, an inner peripheral edge of the case 11 may be formed into a tapered face 117 in a cross section in the direction of the axis L of the case 11, and projections 128 which abut against the tapered face 117 formed on the open end 110 of the case 11 at respective positions at the same time may be formed at four sections (shadowed areas in FIGS. 14(A) and 14(B)) corresponding to between the major axis portion 126 and the minor axis portion 125 of shoulder parts 127 located in the pressure direction (direction shown by the arrow C), as shown in FIGS. 13, 14(A), and 14(B).

With this construction, even if the stem 12 is rotated, resulting in displacement when the stem 12 is registered at the open end 110 of the case 11, the rotation of the stem 12 which causes such displacement is stopped by the four projections 128 formed on the shoulder part 127 of the stem 12. Therefore, since the displacement, such as that shown in FIG. 8(B), does not occur between the case 11 and the stem 12, the case 11 and the stem 12 are registered so that the minor axis portions 115 and 125 and the major axis portions 116 and 126 correspond to one another, as shown in FIG. 8(A). Therefore, since a portion having no pressure allowance is not generated between the case 11 and the stem 12, incomplete gas-tightness does not occur.

Here, the projections 128 can be formed by deep-drawing of the shoulder part 127 (the metal outer ring constituting the stem 12) of the stem 12, by solder balls fixed to the a shoulder part 127 of the stem 12, or by thick solder plating formed on the shoulder part 127 of the stem 12.

When the stem 12 is registered against the open end 110 of the case 11 in the piezoelectric resonator container 10, if vibrations generated by an ultrasonic vibrator (not shown) or a piezoelectric element (not shown) are transmitted to the case 11 or the stem the case 11 or the stem 12 is displaced to a proper position while vibrating. Therefore, the case 11 and the stem 12 are registered so that the minor axis portions 115 and 125 and the major axis portions 116 and 126 correspond to one another, as shown in FIG. 8(A).

Figure 15:
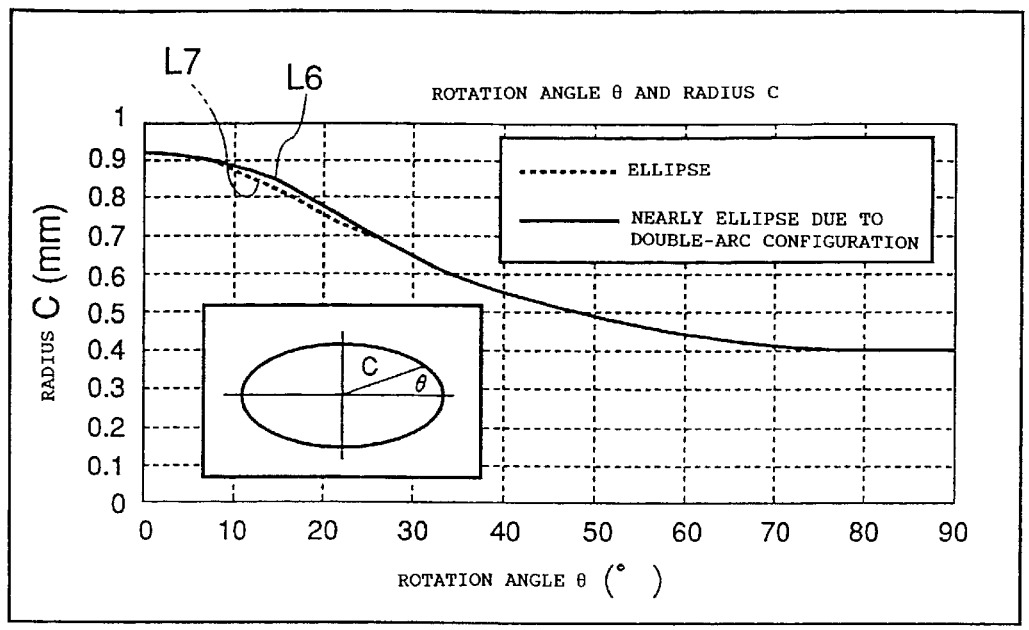
FIGS. 15(A) and 15(B) are graphs showing the relationship between a position of a stem on the outer periphery (rotation angle θ) and an external dimension (radius C), and a rate of change of the external dimension (radius C) with respect to the position of the stem on the outer periphery (rotation angle θ), respectively.
Figure 15:
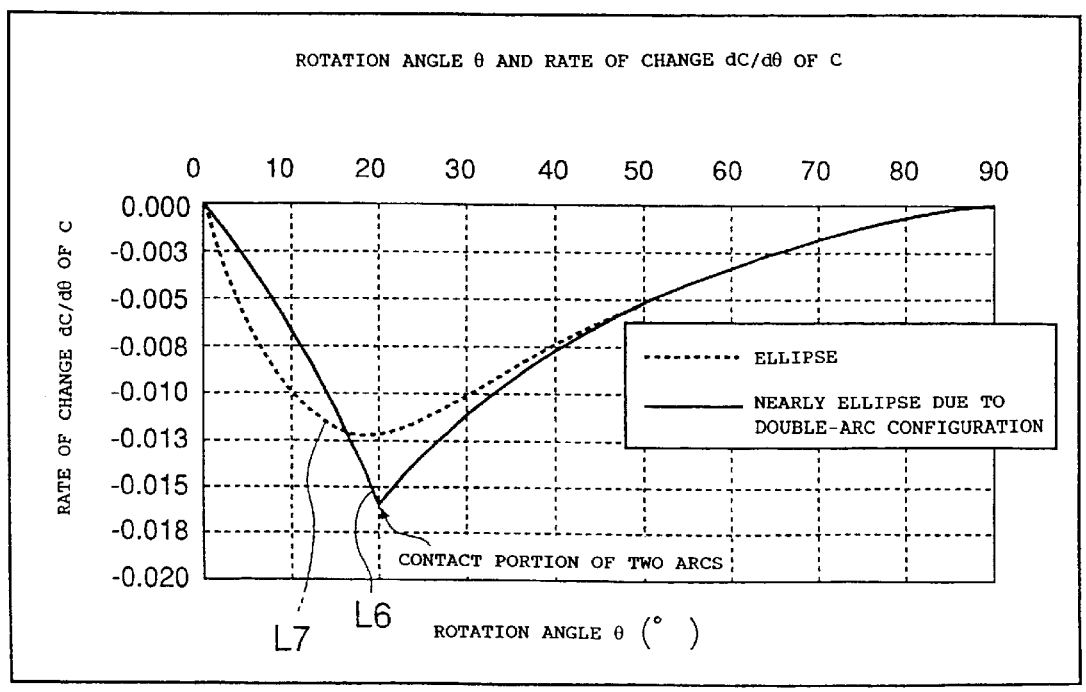

The projections 128 are formed at positions corresponding to between the minor axis portion 125 and the major axis portion 126, based on the results of examinations as shown in FIGS. 15(A) and 15(B).

FIGS. 15(A) and 15(B) are graphs showing the relationship between the position of the stem 12 on the outer periphery (rotation angle θ) and the external dimension (radius C), and a rate of change of the external dimension (radius C) with respect to the position of the stem 12 on the outer periphery (rotation angle θ), respectively. In FIGS. 15(A) and 15(B), the relationship between the position of the stem 12 on the outer periphery (rotation angle θ) and the external dimension (radius C), and the relationship between the position of the stem 12 on the outer periphery (rotation angle θ) and the rate of change of the external dimension (radius C) are shown by L6 and L7, respectively, for a case where the case 11 and the stem 12 described in the first embodiment each having a nearly elliptical cross section are used, and for a case where the case 11 and the stem 12 described in the second embodiment each having an elliptical cross section are used.

As shown in FIGS. 15(A) and 15(B), even in the piezoelectric resonator container 10 according to any one of the first and second embodiments, the rate of change of the external dimension (radius C) with respect to the rotation angle θ is remarkably large in a range in which the rotation angle of 20°±10° is formed against the major axis portion 126. Therefore, if the projections 128 are formed on the shadowed areas in FIGS. 14(A) and 14(B) corresponding to such positions, the rotation of the stem 12 can be prevented by the four projections 128, so that the displacement does not occur between the case 11 and the stem 12. Therefore, according to this manufacturing method, since the displacement, such as that shown in FIG. 8(B), does not occur between the case 11 and the stem 12, the case 11 and the stem 12 are registered so that the minor axis portions 115 and 125 and the major axis portions 116 and 126 correspond to one another. Therefore, since a portion having no pressure allowance is not produced between the case 11 and the stem 12, incomplete gas-tightness does not occur.

[Sixth Modification of First and Second Embodiments]

Figure 16:
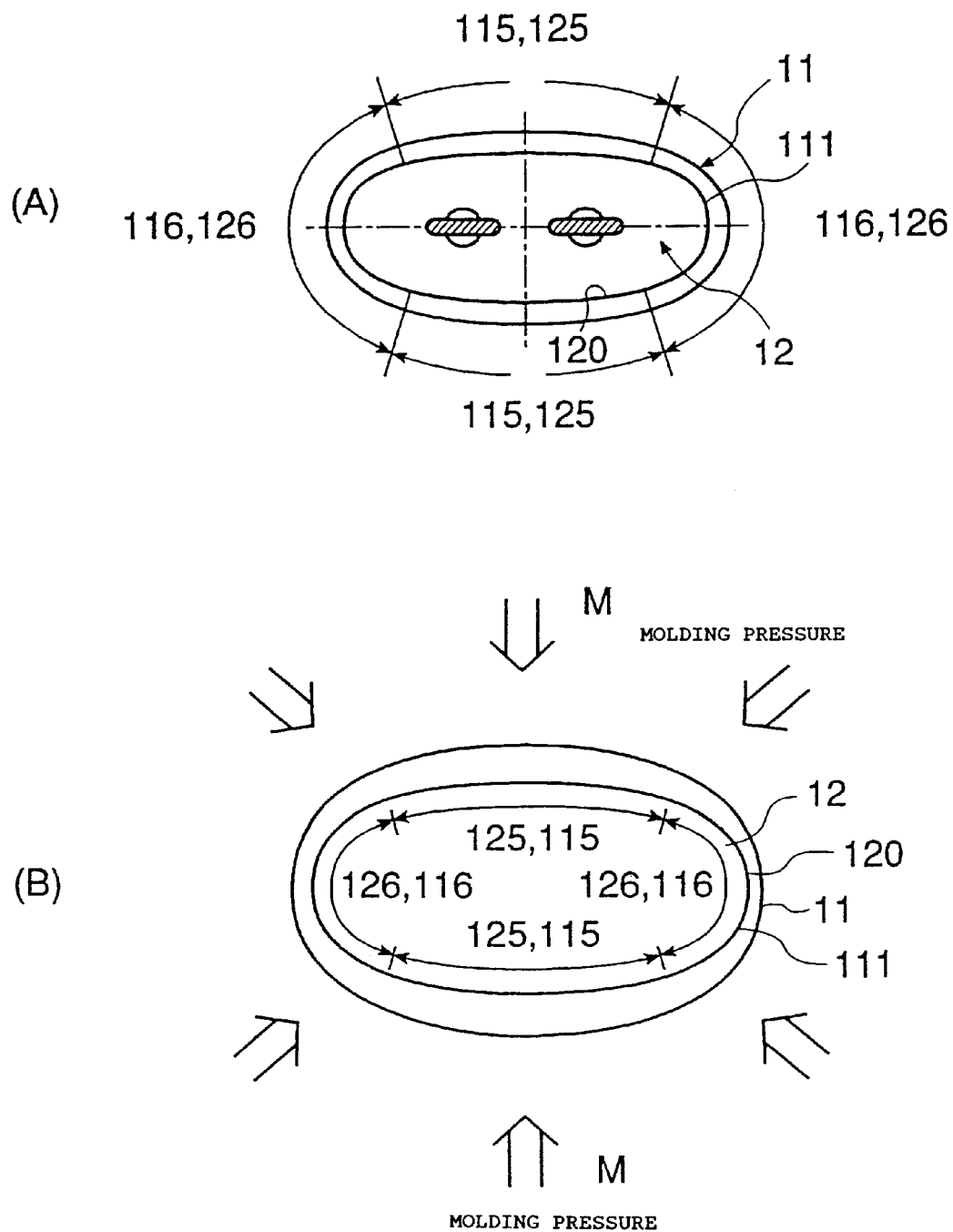
FIGS. 16(A) and 16(B) are illustrations showing the thickness of a case in the circumferential direction of the piezoelectric resonator container according to a sixth modification of the first and second embodiments of the present invention, and showing a state where pressure is applied to the piezoelectric resonator container, respectively.

FIGS. 16(A)–(B) include illustrations showing cross-sectional configurations of a case 11 and a stem 12 in a piezoelectric resonator container 10 of this modification, and showing a thickness of a portion of the case 11.

As shown in FIGS. 16(A)–(B) the case 11 and the stem 12 each having a nearly elliptical cross section, or the case 111 and the stem 12 each having an elliptical cross section as described in the first and second embodiments are also used in this modification. The pressure allowance monotonically increases from the major axis toward the minor axis of the case 11.

Furthermore, in this modification, the thickness of the case 11 at a major axis portion 116 is less than the thickness at the minor axis portion 115. For example, the thickness of the case 11 shows a monotonic decrease from the position where a rotation angle of 20°±10° is formed against the major axis portion 116 toward the major axis portion 116.

Results of calculations of vertical stress and tensile strength regarding the piezoelectric resonator container 10 using the thus-formed case 11 are shown by the symbols □ and the broken line L2 in FIGS. 4(A) and 4(B). As is apparent from FIG. 4(A), when the piezoelectric resonator container 10 of this modification is used, since the pressure allowance is also set to be large at the minor axis portion 115 where the vertical stress tends to decrease, the vertical stress is above the lower limit value over the entirety thereof. When the piezoelectric resonator container 10 of this modification is used, as is apparent from FIG. 4(B), since the thickness is reduced at the major axis portion where the tensile stress tends to increase as compared with the piezoelectric resonators according to the first and second embodiments, the tensile stress generated at the major axis portion 116 is decreased, and the tensile stress is below the upper limit value over the entirety thereof. Therefore, incomplete gas-tightness due to inadequate sealing or the breaking of the case 11 does not occur.

A reduction in the thickness of the case 11 at the major axis portion 116, and an increase in the thickness of the case 11 at the minor axis portion 115 as in the piezoelectric resonator container 10 of this modification offers an advantage in that the case 111 is difficult to deform even if pressure is applied to the minor axis portion 115, as compared with a situation in which the case 11 has a uniform thickness. As shown in FIG. 16(B), even if molding pressures (shown by the arrows M) are applied to the minor axis portion 115 of the case 11 when a piezoelectric resonator 20 is resin-molded together with an IC and the like, since the minor axis portion 115 is formed to be thick, the minor axis portion 115 of the case 11 is not depressed to reduce gas-tightness of the piezoelectric resonator container 10.

[Seventh Modification of the First and Second Embodiments]

Figure 17:
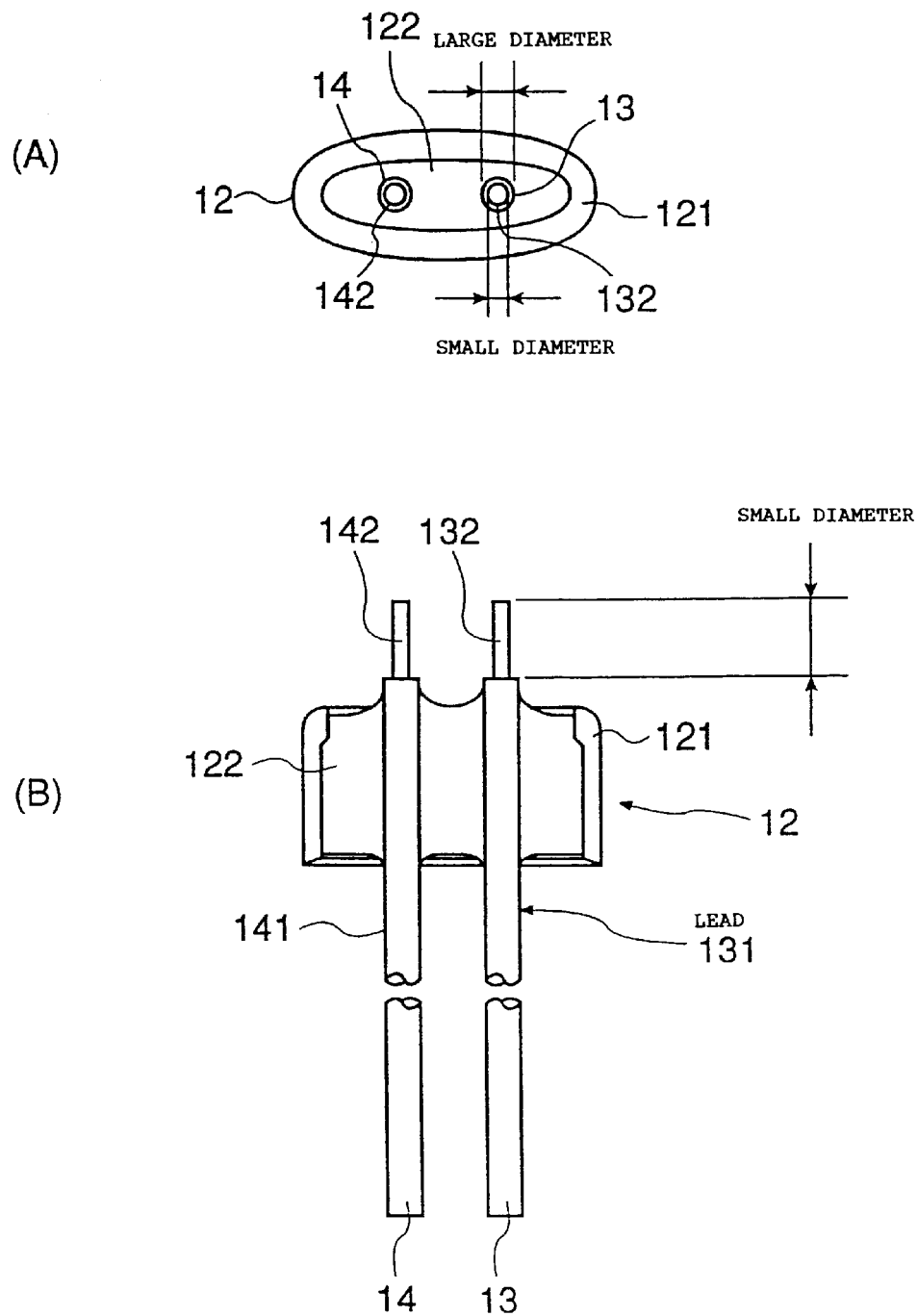
FIGS. 17(A) and 17(B) are a front view and a sectional plan view of a stem, respectively, showing a diameter of an inner lead portion extending from the stem in a piezoelectric resonator container according to a seventh modification of the first and second embodiments of the present invention.

FIGS. 17(A) and 17(B) are a front view and a sectional plan view of a stem 12 using a piezoelectric resonator container 10 of this modification, respectively.

Figure 18:
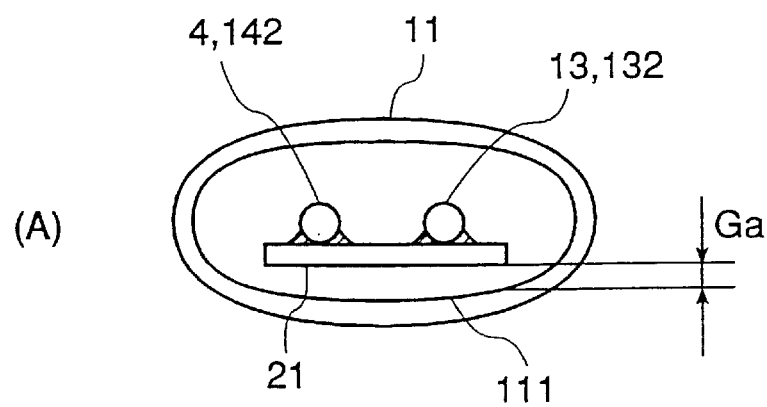
FIGS. 18(A), 18(B), and 18(C) are illustrations showing a gap between the inner periphery of the case and a piezoelectric resonator piece in the piezoelectric resonator container according to the first and second embodiments of the present invention, a gap between the inner periphery of a case and a piezoelectric resonator piece in a piezoelectric resonator container according to an eighth modification of the first and second embodiments of the present invention, and a gap between the inner periphery of the case and a piezoelectric resonator piece in the piezoelectric resonator container according to the seventh modification of the first and second embodiments of the present invention, respectively.
Figure 18:
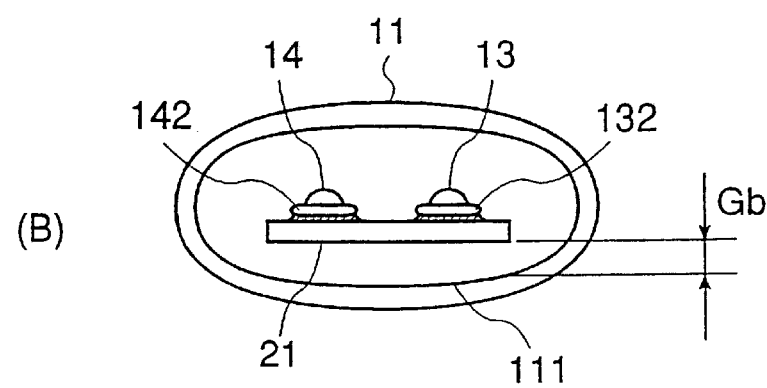
Figure 18:
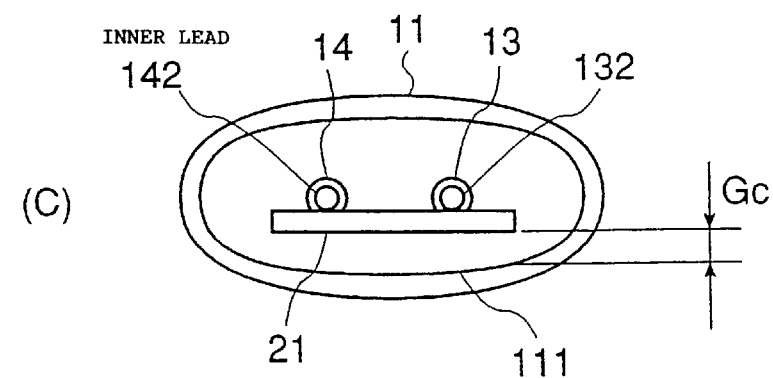

As shown in FIGS. 17(A) and 17(B), in this modification, in leads 13 and 14 fixed to the stem 12, diameters of inner lead portions 132 and 142 to be superimposed on mounting portions 23 of a piezoelectric resonator piece 21 in a case 11 are smaller than those of outer lead portions 131 and 141. Therefore, even if the gap size Ga between the piezoelectric resonator piece 21 and the inner periphery 111 of the case 11 is narrowed by flattening the case 11 used in the piezoelectric resonator container 10 and by enlarging the pressure allowance of the minor axis portion 125, as shown in FIG. 18(A), since the leads 13 and 14 are used in which the inner lead portions 132 and 142 have small diameters, as shown in FIG. 18(C), the gap size Gc between the piezoelectric resonator piece 21 and the inner periphery 111 of the case 11 is wide by the degree of thinness of the inner lead portions 132 and 142. Therefore, according to this modification, even in a situation in which the case 11 used in the piezoelectric resonator container 10 is flattened and the large pressure allowance of the minor axis portion 125 is secured, the piezoelectric resonator piece 21 does not touch the inner periphery 111 of the case 11, even if it is flexed by a fall or the like. Therefore, breakage or chipping of the piezoelectric resonator piece 21 by the piezoelectric resonator piece 21 being flexed by a fall or the like and touching the inner periphery 111 of the case 11 can be prevented.

[Eighth Modification of First and Second Embodiments]

Similarly to the seventh modification, it is an object of this modification to ensure a sufficient gap size between a piezoelectric resonator piece 21 and the inner periphery 111 of a case 11 even if the case 11 used in the piezoelectric resonator container 10 is flattened and the pressure allowance of the minor axis portion 125 is increased.

Figure 19:
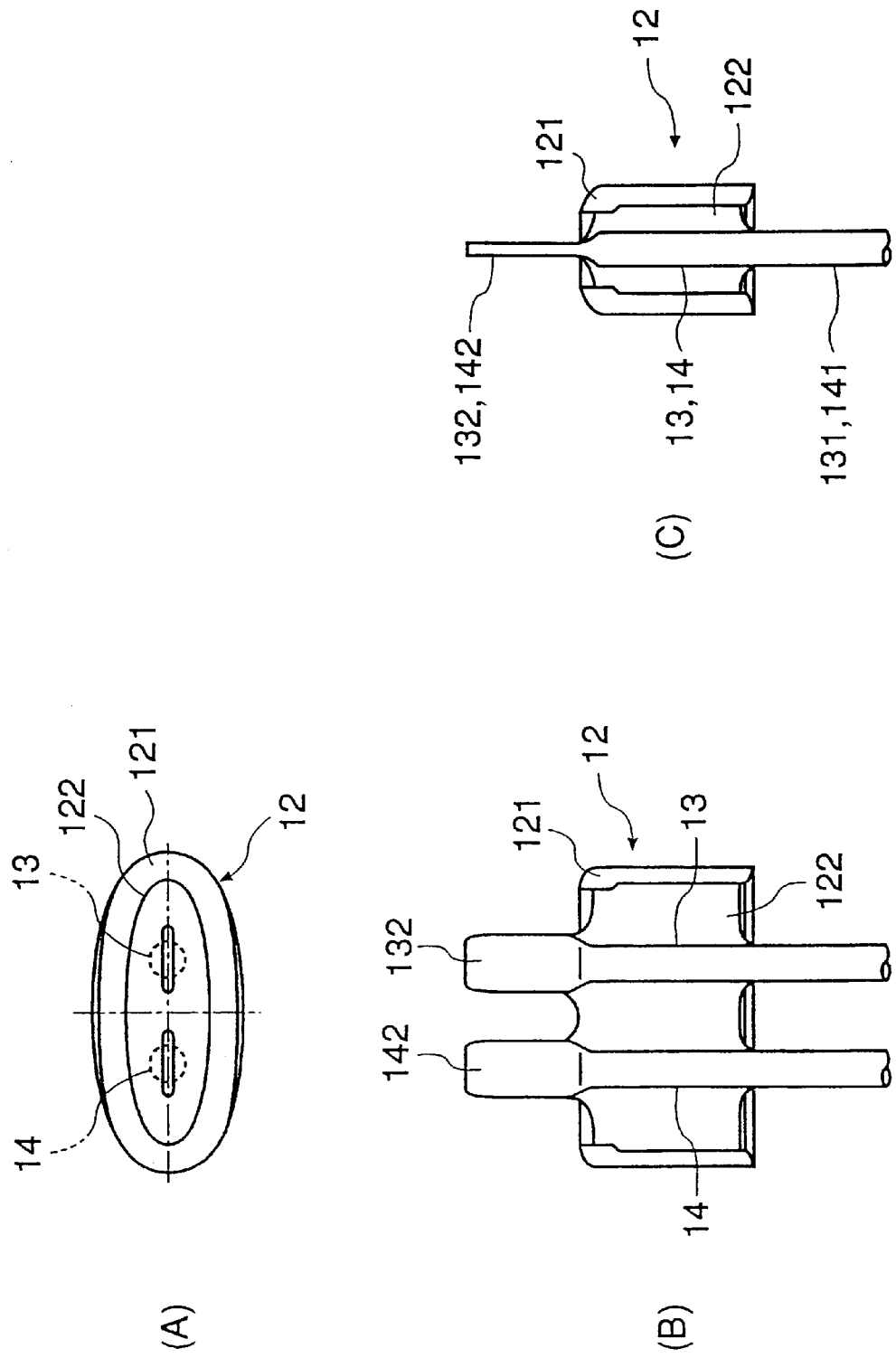
FIGS. 19(A), 19(B), and 19(C) are a front view, a sectional plan view, and a sectional side view, respectively, of a stem used in the piezoelectric resonator container according to the eighth modification of the first and second embodiments of the present invention.

FIGS. 19(A), 19(B), and 19(C) are a front view, a sectional plan view, and a sectional side view, respectively, of a stem 12 used in a piezoelectric resonator container of this modification.

As shown in FIGS. 19(A), 19(B), and 19(C), in this modification, in leads 13 and 14 fixed to the stem 12, inner lead portions 132 and 142 to be superimposed on mounting portions 23 of a piezoelectric resonator piece 21 in a case 11 are flattened. Therefore, even if the gap size Ga between the piezoelectric resonator piece 21 and the inner periphery 111 of the case 11 is narrowed by flattening the case 111 used in the piezoelectric resonator container 10 and by enlarging the pressure allowance of the minor axis portion 125, as shown in FIG. 18(A), since the leads 13 and 14 are used in which the inner lead portions 132 and 142 are flattened, as shown in FIG. 18(B), the gap size Gb between the piezoelectric resonator piece 21 and the inner periphery 111 of the case 11 is wide by the degree of thinness of the inner lead portions 132 and 142. Therefore, according to this modification, even in a situation in which the case 11 used in the piezoelectric resonator container 10 is flattened and the large pressure allowance of the minor axis portion 125 is ensured, the piezoelectric resonator piece 21 does not touch the inner periphery 111 of the case 11, even if it is flexed by a fall or the like. Therefore, breakage or chipping of the piezoelectric resonator piece 21 by the piezoelectric resonator piece 21 being flexed by a fall or the like and touching the inner periphery 111 of the case 11 can be prevented.

Figure 20:
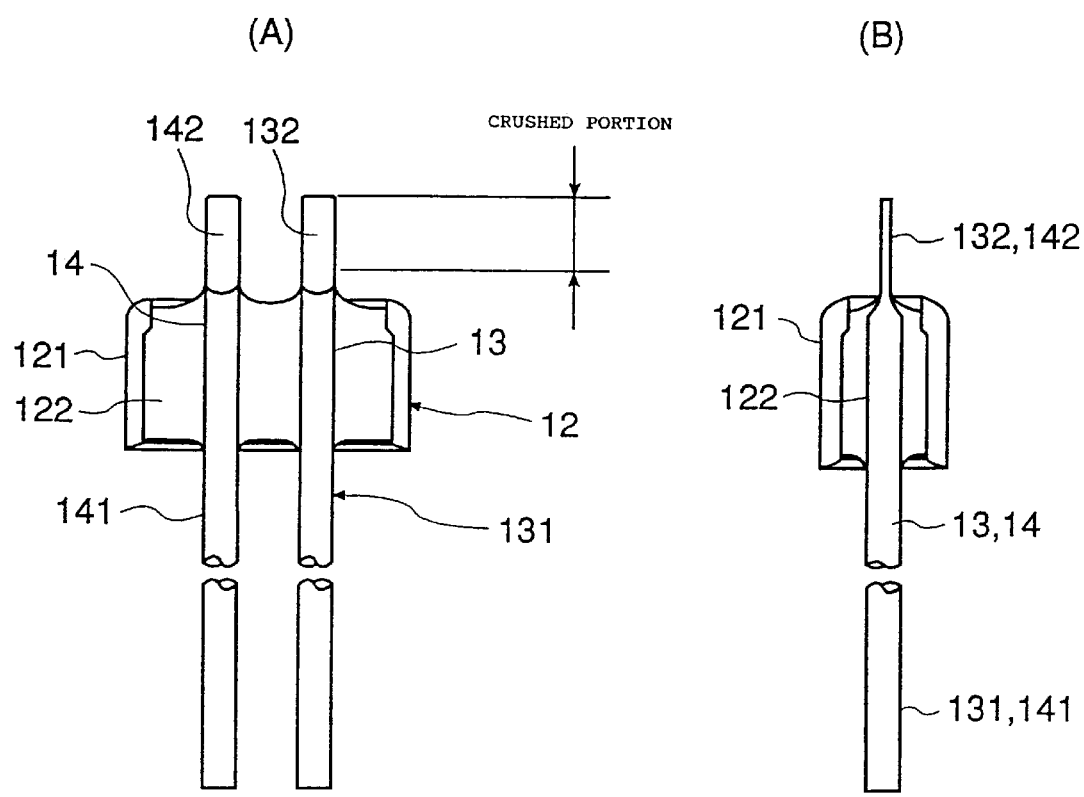
FIGS. 20(A) and 20(B) are a sectional plan view and a sectional side view, respectively, of a stem used in another piezoelectric resonator container according to the eighth modification of the first and second embodiments of the present invention.

In this modification, as shown in FIG. 19(A), in flattening the inner lead portions 132 and 142, round-bar inner lead portions are treated for pressing. Therefore, although the inner lead portions 132 and 142 are wider than outer lead portions 131 and 142, the inner lead portions 132 and 142 may be used in which the width size thereof is formed to be equal to the diameter of the outer lead portions 131 and 141, as shown in FIGS. 20(A) and 20(B).

Figure 21:
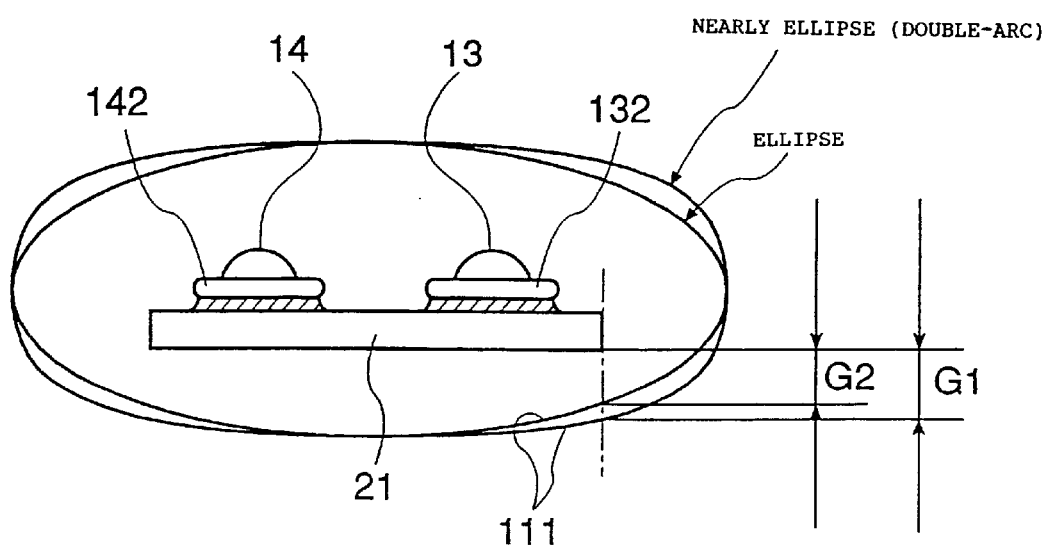
FIG. 21 is an illustration showing a gap between the inner peripheries of two types of cases having different cross-sectional configurations and the piezoelectric resonator piece in the piezoelectric resonator container according to the eighth modification of the first and second embodiments of the present invention.

As shown in this modification and the seventh modification, even if the case 11 used in the piezoelectric resonator container 10 is flattened and the pressure allowance of the minor axis portion 125 is increased, considered from the viewpoint of ensuring a sufficient gap between the piezoelectric resonator piece 21 and the inner periphery 111 of the case 11, a gap size G1 which can be ensured between the piezoelectric resonator piece 21 and the inner periphery 111 of the case 11 when the cross section of the case 11 is formed to have a nearly elliptical shape (first embodiment) is wider than the gap size G2 which can be ensured between the piezoelectric resonator piece 21 and the inner periphery 111 of the case 11 when the cross section of the case is formed to have an elliptical shape (second embodiment), as shown in FIG. 21. Therefore, from the viewpoint of preventing breakage or chipping of the piezoelectric resonator piece 21 by the piezoelectric resonator piece 21 being flexed by a fall or the like and touching the inner periphery 111 of the case 11, it is advantageous that the cross sections of the case 11 and the stem 12 are formed to have a nearly elliptical shape (first embodiment), as in the first embodiment.

[Ninth Modification of First and Second Embodiments]

Figure 22:
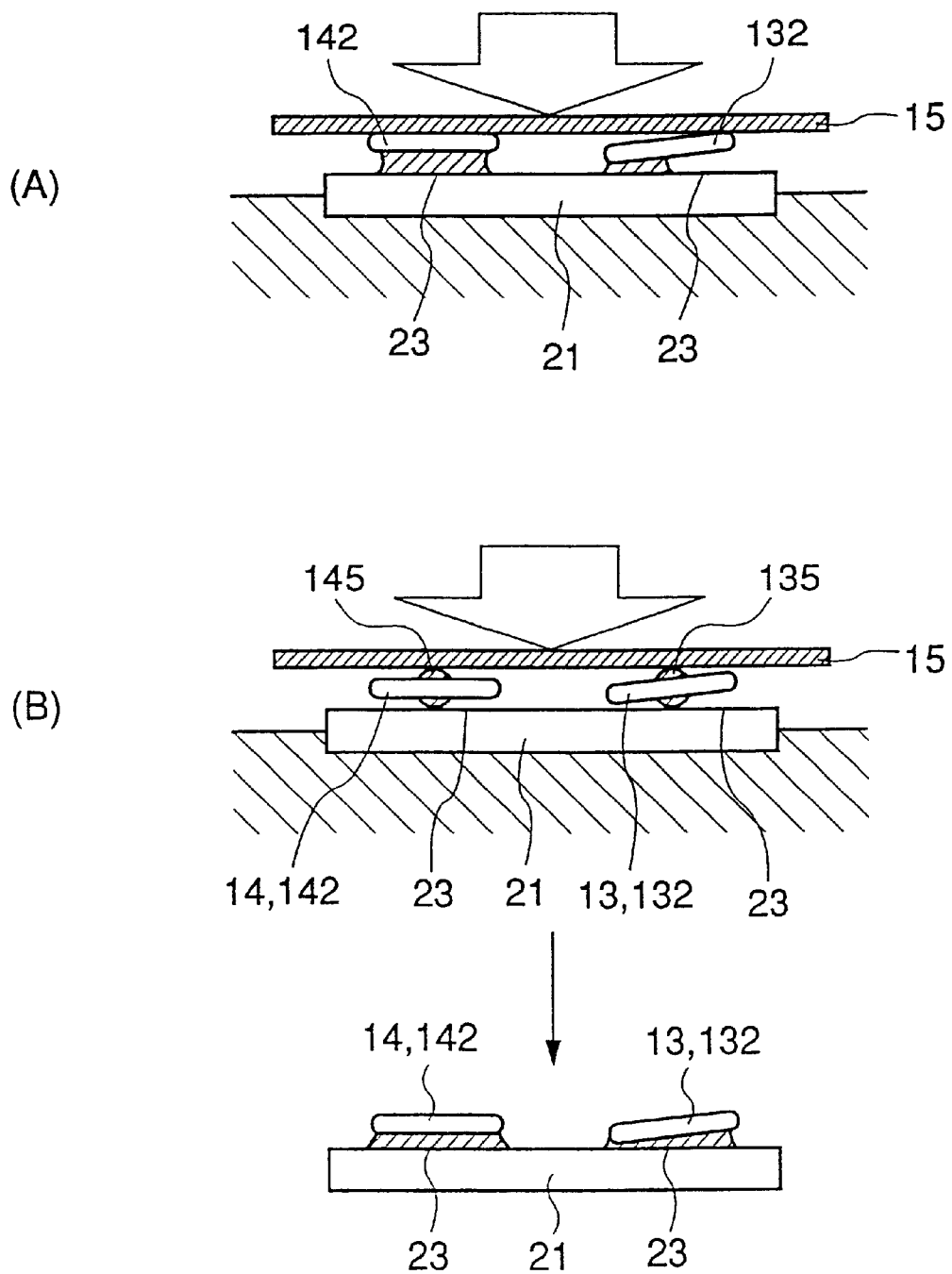
FIG. 22(A) is an illustration for the explanation of a point to be further modified of the piezoelectric resonator container according to the eighth modification of the first and second embodiments of the present invention.
FIG. 22(B) is an illustration of a piezoelectric resonator container according to a ninth modification of the first and second embodiments of the present invention.

It is an object of this modification to prevent a conductive adhesive agent or solder from being placed unevenly between mounting portions 23 of a piezoelectric resonator piece 21 and the inner lead portions 132 and 142, even if the inner lead portions 132 and 142 are inclined when the inner lead portion 132 and 142 are flattened, as shown in FIG. 22(A). That is, as shown in FIG. 22(A), in electrically or mechanically connecting the inner lead portions 132 and 142 to the mounting portions 23 of the piezoelectric resonator piece using the conductive adhesive agent or solder, the inner lead portions 132 and 142 are pressed by a presser plate 15 toward the piezoelectric resonator piece 21. However, if the inner lead portions 132 and 142 are inclined when the inner lead portions 132 and 142 are flat, the inner lead portions 132 and 142 cannot be pressed uniformly by the presser plate 15.

Thus, in this modification, the inner lead portions 132 and 142 are formed with projections 135 and 145 projecting toward the outside from their flat end faces, as shown in FIG. 22(B). Therefore, since the presser plate 15 presses the inner lead portions 132 and 142 toward the piezoelectric resonator piece 21 to the end via the projections 135 and 145 of the inner lead portions 132 and 142, the inner lead portions 132 and 142 can be securely pressed toward the mounting portions 23 of the piezoelectric resonator piece 21 even if the flat inner lead portions 132 and 142 are inclined. Therefore, the conductive adhesive agent or solder can be spread over a wide range between the inner lead portions 132 and 142 and the mounting portions 23 of the piezoelectric resonator piece 21.

Figure 23:
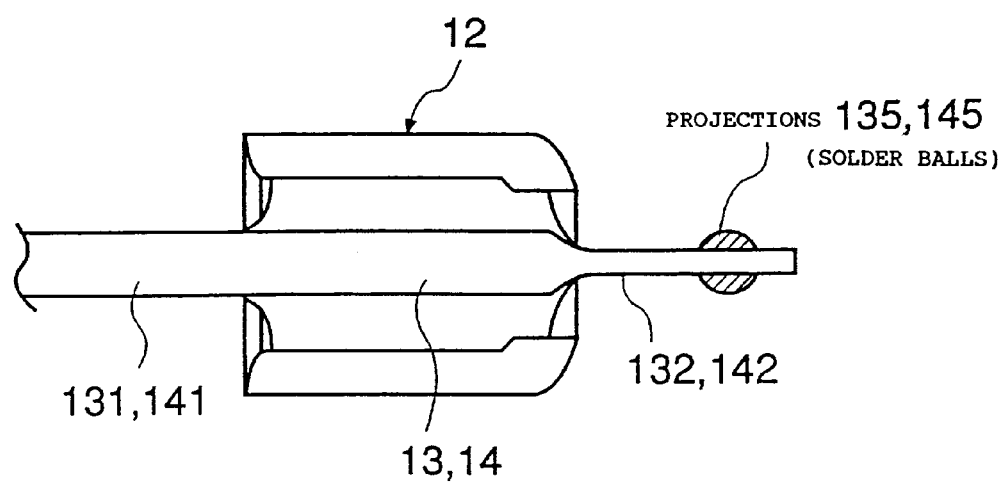
FIG. 23 is an illustration showing a first example of projections formed on an inner lead portion in the piezoelectric resonator container according to the ninth modification of the first and second embodiments of the present invention.
Figure 24:
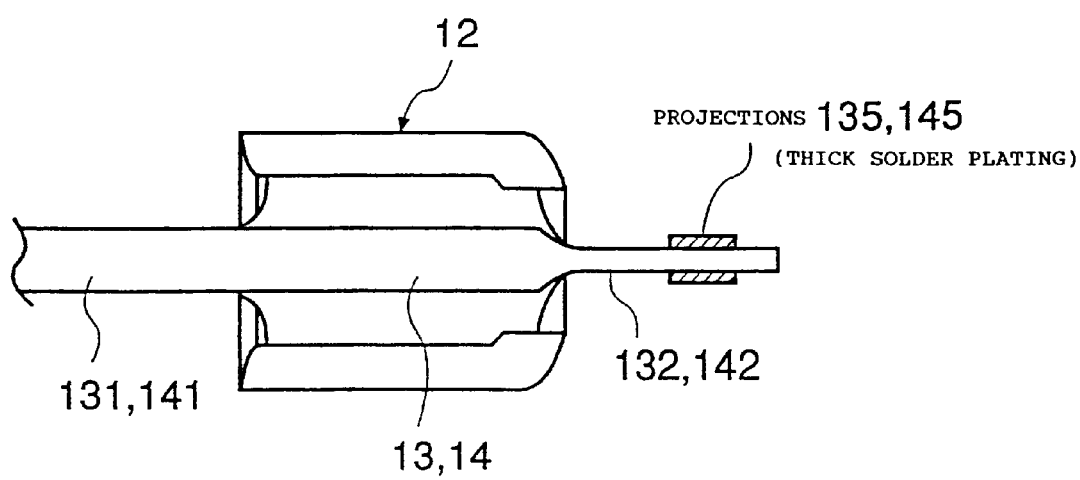
FIG. 24 is an illustration showing a second example of the projections formed on an inner lead portion in the piezoelectric resonator container according to the ninth modification of the first and second embodiments of the present invention.
Figure 25:
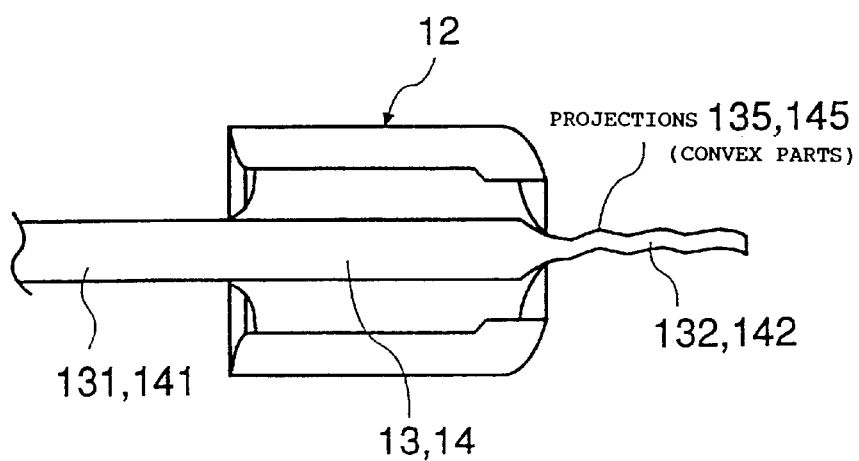
FIG. 25 is an illustration showing a third example of the projections formed on an inner lead portion in the piezoelectric resonator container according to the ninth modification of the first and second embodiments of the present invention.

Here, as a method for forming the projections 135 and 145 on the inner lead portions 132 and 142, for example, a construction in which solder balls are fixed to the inner lead portions 132 and 142 to be used as the projections 135 and 145, as shown in FIG. 23, a construction in which thick solder is plated on the inner lead portions 132 and 142 to be used as the projections 135 and 145, as shown in FIG. 24, and furthermore a construction in which the inner lead portions 132 and 142 are deformed by mechanical process, and convex parts formed thereby are used as the projections 135 and 145 can be used, as shown in FIG. 25.

[Tenth Modification of First and Second Embodiments]

Figure 26:
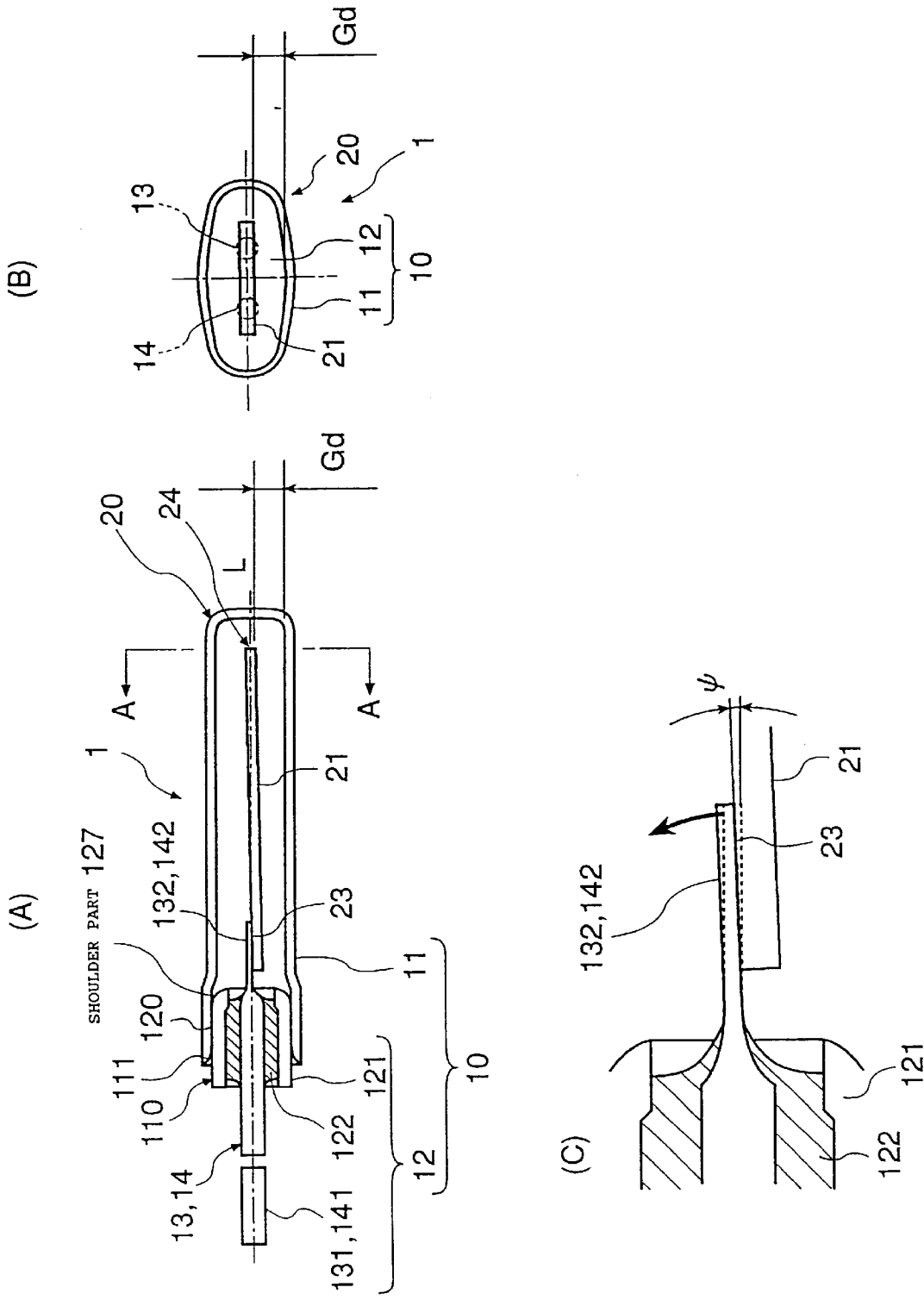
FIGS. 26(A), 26(B), and 26(C) are a sectional side view showing a construction of a piezoelectric resonator according to a tenth embodiment of the present invention, a view in the direction of the arrow A—A in FIG. 26(A), and a partial enlarged view of a mounting portion in FIG. 26(A), respectively.

FIG. 26(A) is a sectional side view showing a construction of a piezoelectric resonator 20 of this modification, FIG. 26(B) is a view in the direction of the arrow 26B–25B' in FIG. 26(A), and FIG. 26(C) is a partial enlarged view of a mounting portion in FIG. 26(A).

As shown in FIGS. 26(A), 26(B), and 26(C), in this modification, in leads 13 and 14 fixed to a stem 12, inner lead portions 132 and 142 to be superimposed on mounting portions 23 of a piezoelectric resonator piece 21 in a case 11 are bent by an angle φ so that an end portion 24 of the piezoelectric resonator piece 21 is placed in the center of a thickness direction of the piezoelectric resonator 20. Therefore, even if the case 11 used in a piezoelectric resonator container 10 is flattened and a pressure allowance of a minor axis portion 125 is increased, the gap size Gd between the piezoelectric resonator piece 21 and the inner periphery 111 of the case 11 is wide by the amount of bending of the inner lead portions 132 and 142. Therefore, according to this modification, even in a case where the case 11 used in the piezoelectric resonator container 10 is flattened and the large pressure allowance of the minor axis portion 125 is secured, the piezoelectric resonator piece 21 does not touch the inner periphery 111 of the case 11 even if it is flexed by a fall or the like. Therefore, breakage or chipping of the piezoelectric resonator piece 21 by the piezoelectric resonator piece 21 being flexed by a fall or the like and touching the inner periphery 111 of the case 11 can be prevented.

As a method for manufacturing the piezoelectric resonator of the tenth modification, a method in which the piezoelectric resonator piece 21 is mounted on the inner leads 132 and 142 that are bent in advance so that the end portion 24 of the piezoelectric resonator piece 21 is placed in the center of the thickness direction of the piezoelectric resonator 20, and a method in which the piezoelectric resonator piece 21 is mounted on the inner leads 132 and 142 while bending the inner leads 132 and 142 so that the end portion 24 of the piezoelectric resonator piece 21 is placed in the center of the thickness direction of the piezoelectric resonator 20, may be considered.

Figure 27:
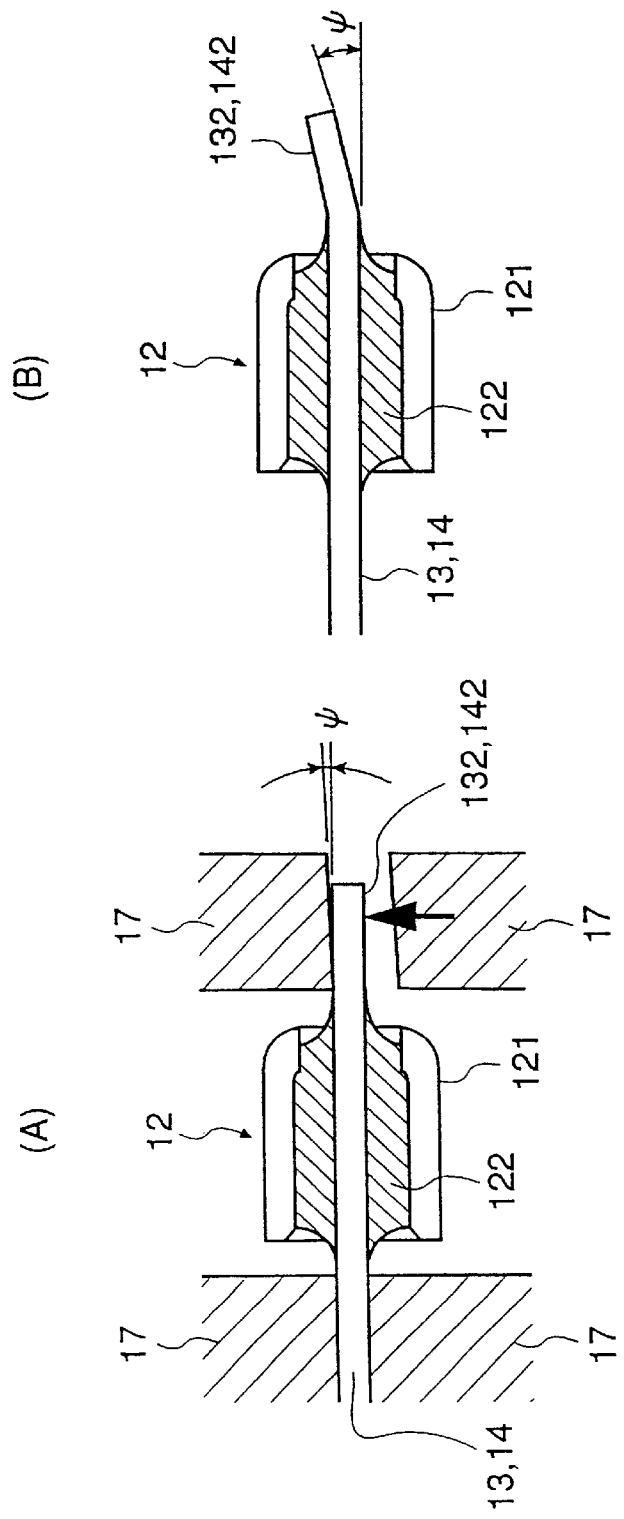

The former method is effective when the inner leads 132 and 142 have a shape or are made of a material which is difficult to bend (for example, when they are thick with a circular cross section, or when they are made of a hard material). First, as shown in FIG. 27(A), a stem 12 is set in an inner lead-bending jig 17, and inner leads 132 and 142 are bent in advance at a predetermined angle (p. Then, the piezoelectric resonator piece 21 and the stem 12 in which the inner leads 132 and 142 are bent in advance (FIG. 27(B)) are set in a jig for mounting the piezoelectric resonator piece 21. According to this method, the piezoelectric resonator 20 having a construction shown in the tenth modification can be easily manufactured.

Figure 28:
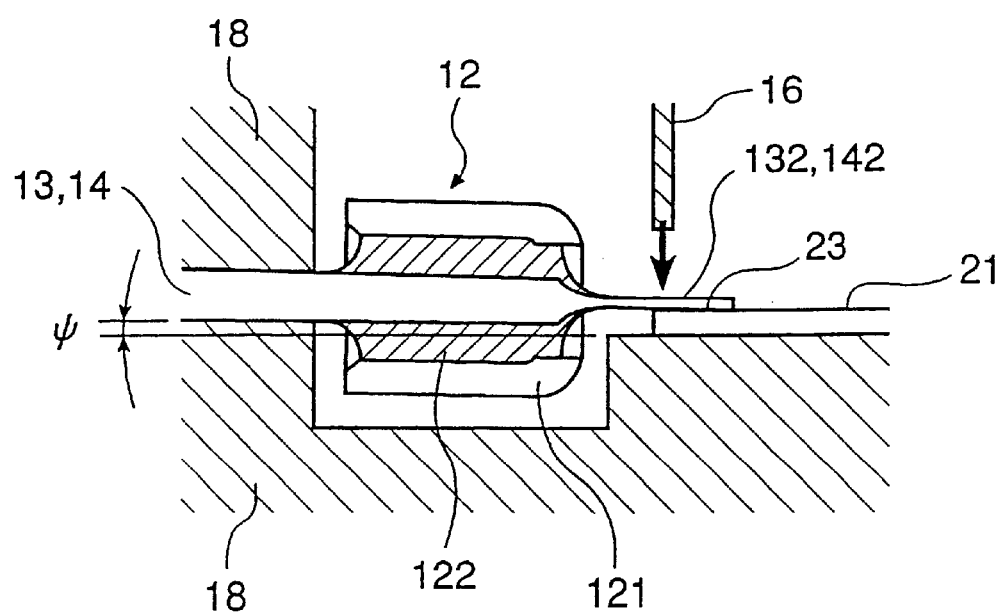
FIG. 28 is an illustration of another method for manufacturing the piezoelectric resonator according to the tenth embodiment of the present invention which is a sectional view of a mounting jig on which a piezoelectric resonator piece and a stem are set.

On the other hand, the latter method is effective when the inner leads 132 and 142 are of a shape or are made of a material which is easy to bend (for example, when they are thin with a circular cross section shown in the seventh modification, when they have a flattened shape shown in the eighth modification, or when they are made of a relatively soft material). As shown in FIG. 28, the piezoelectric resonator piece 21 and the stem 12 are set in a mounting jig 18 in which a portion where the piezoelectric piece 21 is set and a portion where the stem 12 is set are bent at a predetermined angle φ, and the inner leads 132 and 142 are pressed by a presser plate 16 against the piezoelectric resonator piece 21 for mounting. This allows the inner leads 132 and 142 to be bent by the presser plate 16 by the predetermined angle of φ so as to closely adhere to faces of the mounting portions 23 of the piezoelectric resonator piece 21, and mounting is completed. Therefore, according to this method, the piezoelectric resonator 20 having a construction shown in the tenth modification can be manufactured easily and without increasing the number of processes.

[Applications of Embodiments]

Figure 29:
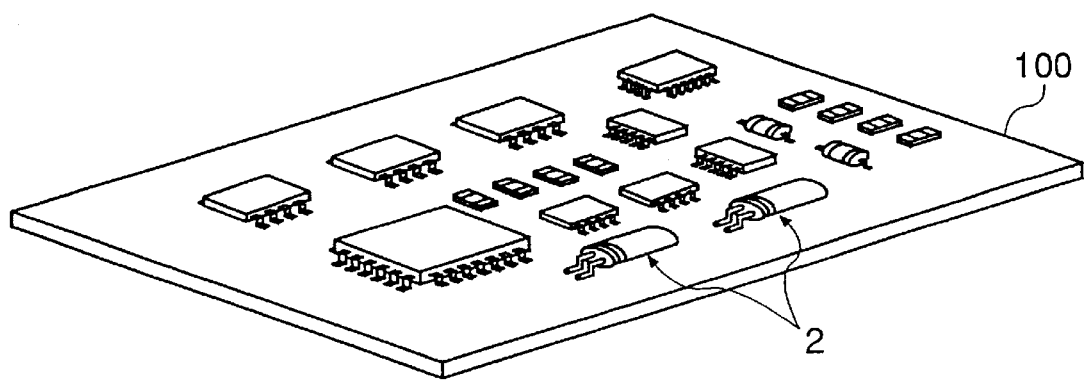
FIG. 29 is a perspective view showing an application in which one of the piezoelectric resonators according to the embodiments of the present invention is mounted on a substrate.

FIG. 29 is a perspective view showing an application in which one of the piezoelectric resonators according to the embodiments of the present invention is mounted on a substrate.

Figure 30:
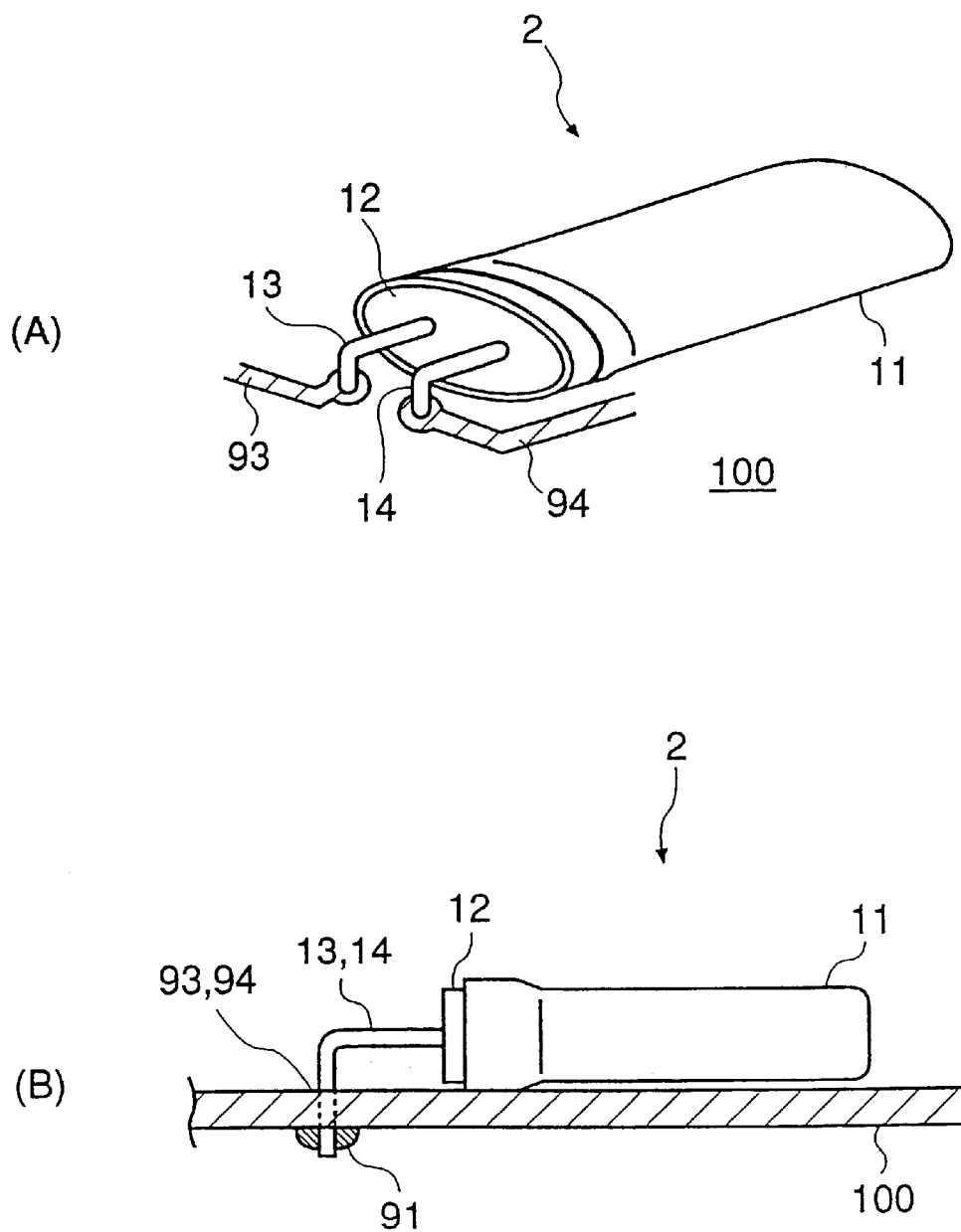
FIGS. 30(A) and 30(B) are a perspective view and a partial sectional view, respectively, showing a construction when the piezoelectric resonator shown in FIG. 29 is soldered on the substrate.
Figure 31:
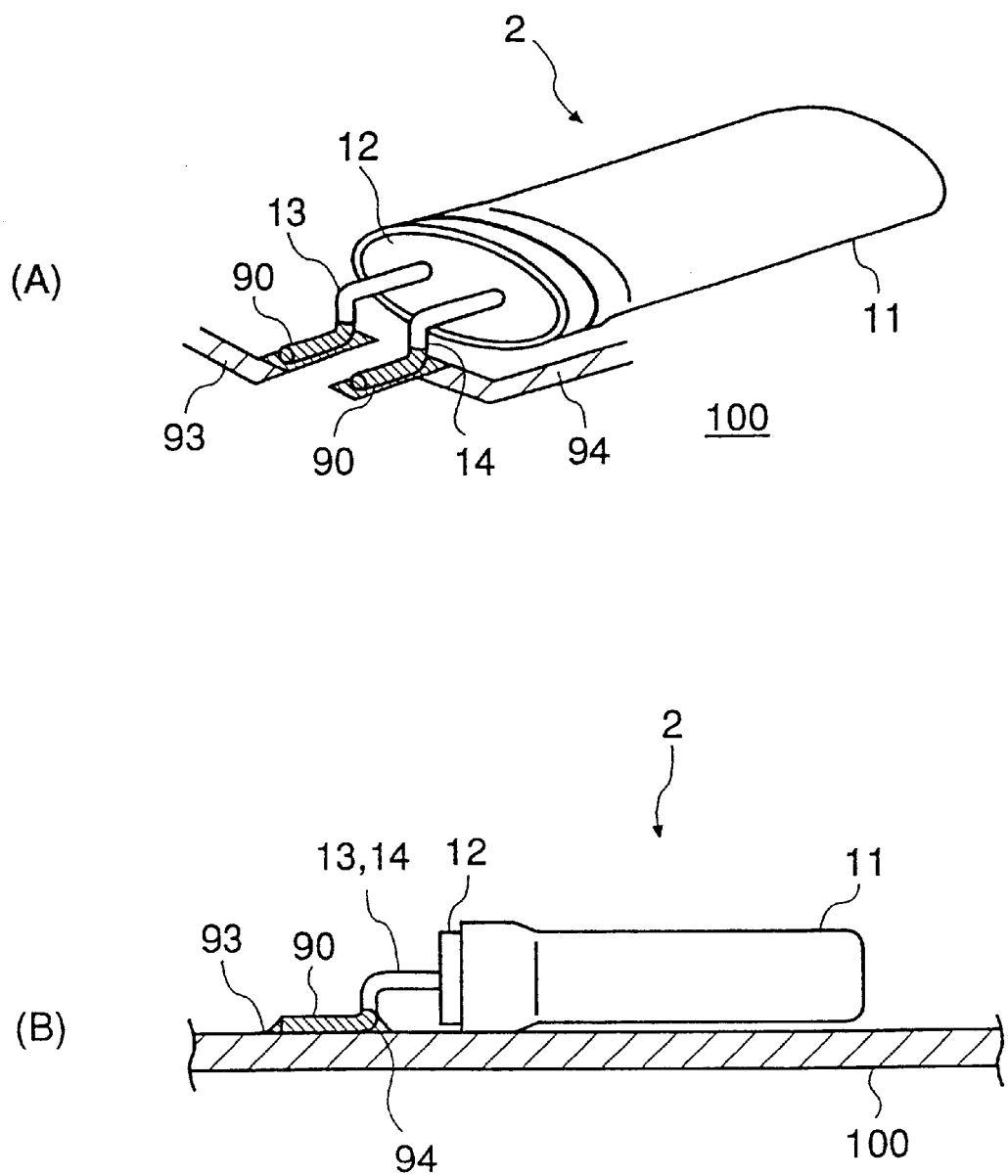
FIGS. 31(A) and 31(B) are a perspective view and a partial sectional view, respectively, showing another construction when the piezoelectric resonator shown in FIG. 29 is soldered on the substrate.

FIGS. 30(A) and 30(B) are a perspective view and a partial sectional view, respectively, showing a construction when a piezoelectric resonator 2 shown in FIG. 29 is soldered on the substrate, and FIGS. 31 (A) and 31(B) are a perspective view and a partial sectional view, respectively, showing another construction when the piezoelectric resonator 2 shown in FIG. 29 is soldered on the substrate.

The piezoelectric resonator 2 according to the above-described embodiments is, for example, mounted on a substrate 100, as shown in FIG. 29. For example, other electrical parts are also mounted on the surface of the substrate 100, and a predetermined wiring for connecting these parts is formed. Holes through which leads 13 and 14 pass, or patterns on which the leads are placed, are formed at position on which the piezoelectric resonator 2 is mounted. The piezoelectric resonator 2 is mounted by the leads 13 and 14 being inserted into these holes, or placed on these patterns, as shown in FIG. 30(A) or FIG. 31(A) and being soldered, as shown in FIG. 30(B) or FIG. 31(B).

As described above, according to the present invention, since the stem and the case have a nearly elliptical or an elliptical cross section, a flat piezoelectric resonator piece can be effectively contained therein, and the thickness of a piezoelectric resonator can be reduced. Therefore, when the piezoelectric resonator is mounted on a substrate, the height in the vertical direction of the mounting surface can be reduced, and the thickness of the substrate for mounting the piezoelectric resonator can be reduced. In addition, since the pressure allowance is set to be large at minor axis portions where vertical stress tends to decrease, the vertical stress is above the lower limit value over the entirety thereof. Furthermore, since the pressure allowance is set to be small at the major axis portions where tensile stress tends to increase, the tensile stress is below the upper limit value over the entirety thereof. Therefore, since incomplete gas-tightness due to inadequate sealing or the breaking of the case does not occur, the piezoelectric resonator with a high degree of reliability can be constructed.

Industrial Applicability

Thus, the present invention is suitably used as a piezoelectric resonator container for containing therein piezoelectric resonator pieces, such as quartz crystal resonators, as a piezoelectric resonator using the piezoelectric resonator container, as a circuit board having the piezoelectric resonator mounted thereon, and as a method for manufacturing a piezoelectric resonator. More particularly, the present invention is suitably used as a technique for sealing an open end of an elliptical or nearly elliptical cylindrical case used in a piezoelectric resonator container.

What is claimed is:

1. A piezoelectric resonator container comprising:

a cylindrical case having a major axis, a minor axis and an open end;

and a stem for sealing the open end of the case, in a cross section of the stem in a direction perpendicular to an axial direction of the case at a portion for contacting the case, an outer periphery of the stem including a minor axis portion having a first radius of curvature, and a major axis portion having a second radius of curvature smaller than the first radius of curvature, and a tangent to the first radius of curvature coinciding with a tangent to the second radius of curvature at a connection portion of the first radius of curvature and the second radius of curvature, in a cross section of the case in a direction perpendicular to an axial direction of the case at a portion for contacting the stem, an inner periphery of the case including a minor axis portion having a third radius of curvature, and a major axis portion having a fourth radius of curvature smaller than the third radius of curvature, and a tangent to the third radius of curvature coinciding with a tangent to the fourth radius of curvature at a connection portion of the third radius of curvature and the fourth radius of curvature, and a pressure allowance for pressing the stem into the open end of the case monotonically increasing from the major axis of the case toward the minor axis.

2. A piezoelectric resonator container comprising a cylindrical case having a major axis, a minor axis and an open end; and a stem for sealing the open end of the case, in a cross section of the stem in a direction perpendicular to an axial direction of the case at a portion for contacting the case, an outer periphery of the stem having an elliptical shape, in a cross section of the case in a direction perpendicular to an axial direction of the case at a portion for contacting the stem, an inner periphery of the case having an elliptical shape, and a pressure allowance for pressing the stem into the open end of the case monotonically increasing from the major axis of the case toward the minor axis.

3. The piezoelectric resonator container as claimed in claim 1, an inner peripheral edge of the open end of the case being formed into a tapered face in a cross section in the axial direction of the case, and a shoulder part located in a pressure direction of the stem having an arc in a cross section in the axial direction of the case, and a radius of curvature of the arc being larger at the minor axis portion than that at the major axis portion of the stem.

4. The piezoelectric resonator container as claim 1, an inner peripheral edge of the open end of the case being formed into a tapered face in a cross section in the axial direction of the case, and a shoulder part located in a pressure direction of the stem having an arc in a cross section in the axial direction of the case, and a center position of the arc being located toward the major axis portion from the minor axis portion of the stem in the pressure direction.

5. The piezoelectric resonator container as claimed in claim 1, an inner peripheral edge of the open end of the case being formed into a tapered face in a cross section in the axial direction of the case, and an angle which the tapered face forms with the axial direction being smaller at the minor axis portion than that at the major axis portion.

6. The piezoelectric resonator container as claimed in claim 1, an inner peripheral edge of the open end of the case being formed into a tapered face in a cross section in the axial direction of the case, and a position of the tapered face in the axial direction being located toward the minor axis portion from the major axis portion of the case in a pressure direction.

7. The piezoelectric resonator container as claimed in claim 1, further comprising projections abutting against an inner peripheral edge of the open end of the case which is formed as a tapered face formed at four sections between the major axis portion and the minor axis portion of shoulder parts located in a pressure direction.

8. The piezoelectric resonator container as claimed in claim 7, the projections being formed by deep-drawing a metal outer ring constituting the stem.

9. The piezoelectric resonator container as claimed in claim 7, the projections being formed by solder balls.

10. The piezoelectric resonator container as claimed in claim 7, the projections being formed by thick solder plating.

11. The piezoelectric resonator container as claimed in claim 1, a thickness of the case at the major axis portion is less than a thickness at the minor axis portion.

12. A piezoelectric resonator comprising:

a piezoelectric resonator piece;

a piezoelectric resonator container containing the piezoelectric resonator piece, the container having a cylindrical case with a major axis, a minor axis, and an open end, and a stem for sealing the open end of the case, in a cross section of the stem in a direction perpendicular to an axial direction of the case at a portion for contacting the case, an outer periphery of the stem including a minor axis portion having a first radius of curvature, and a major axis portion having a second radius of curvature smaller than the first radius of curvature, and a tangent to the first radius of curvature coinciding with a tangent to the second radius of curvature at a connection portion of the first radius of curvature and the second radius of curvature, in a cross section of the case in a direction perpendicular to an axial direction of the case at a portion for contacting the stem, an inner periphery of the case including a minor axis portion having a third radius of curvature, and a major axis portion having a fourth radius of curvature smaller than the third radius of curvature, and a tangent to the third radius of curvature coinciding with a tangent to the fourth radius of curvature at a connection portion of the third radius of curvature and the fourth radius of curvature, and a pressure allowance for pressing the stem into the open end of the case monotonically increasing from the major axis of the case toward the minor axis.

13. A piezoelectric resonator in which a piezoelectric resonator piece is contained in a piezoelectric resonator container having a cylindrical case with a major axis, a minor axis and an open end, and a stem for sealing the open end of the case, in a cross section of the stem in a direction perpendicular to an axial direction of the case at a portion for contacting the case, an outer periphery of the stem having an elliptical shape, in a cross section of the case in a direction perpendicular to an axial direction of the case at a portion for contacting the stem, an inner periphery of the case having an elliptical shape, and a pressure allowance for pressing the stem into the open end of the case monotonically increasing from the major axis of the case toward the minor axis.

14. The piezoelectric resonator as claimed in claim 12, an inner peripheral edge of the open end of the case being formed into a tapered face in a cross section in the axial direction of the case, and a shoulder part located in a pressure direction of the stem having an arc in a cross section in the axial direction of the case, and a radius of curvature of the arc being larger at the minor axis portion than that at the major axis portion of the stem.

15. The piezoelectric resonator as claimed in claim 12, an inner peripheral edge of the open end of the case being formed into a tapered face in a cross section in the axial direction of the case, and a shoulder part located in a pressure direction of the stem having an arc in a cross section in the axial direction of the case, and a center position of the arc being located toward the major axis portion from the minor axis portion of the stem in a pressure direction.

16. The piezoelectric resonator as claimed in claim 12, an inner peripheral edge of the open end of the case being formed into a tapered face in a cross section in the axial direction of the case, and an angle which the tapered face forms with the axial direction being smaller at the minor axis portion than that at the major axis portion.

17. The piezoelectric resonator as claimed in claim 12, an inner peripheral edge of the open end of the case being formed into a tapered face in a cross section in the axial direction of the case, and a position of the tapered face in the axial direction being located toward the minor axis portion from the major axis portion of the case in a pressure direction.

18. The piezoelectric resonator as claimed in claim 12, further comprising projections abutting against an inner peripheral edge of the open end of the case which is formed as a tapered face formed at four sections between the major axis portion and the minor axis portion of shoulder parts located in a pressure direction.

19. The piezoelectric resonator as claimed in claim 18, the projections being formed by deep-drawing a metal outer ring constituting the stem.

20. The piezoelectric resonator as claimed in claim 18, the projections being formed by solder balls.

21. The piezoelectric resonator as claimed in claim 18, the projections being formed by thick solder plating.

22. The piezoelectric resonator as claimed in claim 12, a thickness of the case at the major axis portion being less than the thickness at the minor axis portion.

23. The piezoelectric resonator as claimed in claim 12, further comprising leads fixed to the stem, diameters of inner lead portions to be superimposed on mounting portions of the piezoelectric resonator in the case being smaller than those of other lead portions.

24. A piezoelectric resonator as claimed in claim 12, further comprising leads fixed to the stem, inner lead portions to be superimposed on mounting portions of the piezoelectric resonator in the case being flattened.

25. The piezoelectric resonator as claimed in claim 24, the inner lead portions being formed with projections projecting toward an outside from flat faces of the inner lead portions.

26. The piezoelectric resonator as claimed in claim 25, the projections being formed by solder balls.

27. The piezoelectric resonator as claimed in claim 25, the projections being formed by thick solder plating.

28. The piezoelectric resonator as claimed in claim 25, the projections being formed by deformed portions of the inner lead portions.

29. The piezoelectric resonator as claimed in claim 12, further comprising in leads fixed to the stem, inner lead portions to be superimposed on mounting portions of the piezoelectric resonator piece in the case being bent so that an end portion of the piezoelectric resonator piece is placed in a center of a thickness direction of the piezoelectric resonator.

30. The piezoelectric resonator as claimed in claim 23, the inner lead portions being bent so that an end portion of the piezoelectric resonator piece is placed in a center of a thickness direction of the piezoelectric resonator.

31. A circuit board having mounted thereon a piezoelectric resonator in which a piezoelectric resonator piece is contained in a piezoelectric resonator container having a cylindrical case with a major axis, a minor axis and an open end, and a stem for sealing the open end of the case, in a cross section of the stem in a direction perpendicular to an axial direction of the case at a portion for contacting the case, an outer periphery of the stem including a minor axis portion having a first radius of curvature, and a major axis portion having a second radius of curvature smaller than the first radius of curvature, and a tangent to the first radius of curvature coinciding with a tangent to the second radius of curvature at a connection portion of the first radius of curvature and the second radius of curvature, in a cross section of the case in a direction perpendicular to an axial direction of the case at a portion for contacting the stem, an inner periphery of the case including a minor axis portion having a third radius of curvature, and a major axis portion having a fourth radius of curvature smaller than the third radius of curvature, and a tangent to the third radius of curvature coinciding with a tangent to the fourth radius of curvature at a connection portion of the third radius of curvature and the fourth radius of curvature, and a pressure allowance for pressing the stem into the open end of the case monotonically increasing from the major axis of the case toward the minor axis.

32. A circuit board having mounted thereon a piezoelectric resonator in which a piezoelectric resonator piece is contained in a piezoelectric resonator container having a cylindrical case with a major axis, a minor axis and an open end, and a stem for sealing the open end of the case, in a cross section of the stem in a direction perpendicular to an axial direction of the case at a portion for contacting the case, an outer periphery of the stem having an elliptical shape, in a cross section of the case in a direction perpendicular to an axial direction of the case at a portion for contacting the stem, an inner periphery of the case having an elliptical shape, and a pressure allowance for pressing the stem into the open end of the case monotonically increasing from the major axis of the case toward the minor axis.

* * * * *